(12) United States Patent
Svajda et al.

(10) Patent No.: US 11,811,904 B2
(45) Date of Patent: Nov. 7, 2023

(54) ADAPTIVE CONTROL OF BIAS SETTINGS IN A DIGITAL MICROPHONE

(71) Applicant: INVENSENSE, INC., San Jose, CA (US)

(72) Inventors: Miroslav Svajda, San Jose, CA (US); Dusan Vecera, Stupava (SK); Igor Mucha, Bratislava (SK)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 17/314,850

(22) Filed: May 7, 2021

(65) Prior Publication Data

US 2022/0116196 A1 Apr. 14, 2022

Related U.S. Application Data

(60) Provisional application No. 63/090,386, filed on Oct. 12, 2020.

(51) Int. Cl.
*H04L 7/00* (2006.01)
*G06F 3/16* (2006.01)
(Continued)

(52) U.S. Cl.
CPC ............ *H04L 7/0008* (2013.01); *G06F 3/162* (2013.01); *H04R 3/00* (2013.01); *H04R 19/04* (2013.01);
(Continued)

(58) Field of Classification Search
CPC ......... H04L 7/0008; G06F 3/162; H03R 3/00; H04R 19/04; H04R 29/004; H04R 2201/003; H04R 17/02; H03F 3/183; H03F 2200/03; G10H 5/002; H03D 13/003; G01R 23/10; H04M 1/00
See application file for complete search history.

(56) References Cited

U.S. PATENT DOCUMENTS

| | | | | |
|---|---|---|---|---|
| 2004/0196171 | A1* | 10/2004 | Yang | H03D 13/003 |
| | | | | 341/157 |
| 2008/0284406 | A1* | 11/2008 | Kapusta, Jr. | H03F 3/45475 |
| | | | | 323/318 |
| 2010/0026542 | A1* | 2/2010 | Wang | H03F 3/005 |
| | | | | 327/554 |

(Continued)

*Primary Examiner* — Carolyn R Edwards
*Assistant Examiner* — Kuassi A Ganmavo
(74) *Attorney, Agent, or Firm* — Amin, Turocy & Watson, LLP

(57) ABSTRACT

Technologies are provided for adaptive control of bias settings in a digital microphone. In some embodiments, a device includes a first component that provides data indicative of a clock frequency of operation in a functional mode of a digital microphone. The clock frequency clocks one or more microphone components having switching activity. The device also can include a second component that determines, using the clock frequency, an amount of bias current to supply to at least a first microphone component of the one or more microphone components. The device can further include a memory device that retains control parameters that include at least one of a first subset of parameters defining a relationship between current and frequency and a second subset of parameters defining a quantization of the relationship. The quantization including multiple bias current levels for respective frequency intervals.

22 Claims, 18 Drawing Sheets

(51) Int. Cl.
  *H04R 19/04*   (2006.01)
  *H04R 3/00*    (2006.01)
  *H04R 29/00*   (2006.01)
  *H03F 3/183*   (2006.01)
  *H03D 13/00*   (2006.01)
  *G10H 5/00*    (2006.01)
  *H04M 1/00*    (2006.01)
  *G01R 23/10*   (2006.01)

(52) U.S. Cl.
  CPC .......... *H04R 29/004* (2013.01); *G01R 23/10* (2013.01); *G10H 5/002* (2013.01); *H03D 13/003* (2013.01); *H03F 3/183* (2013.01); *H03F 2200/03* (2013.01); *H04M 1/00* (2013.01); *H04R 2201/003* (2013.01)

(56) References Cited

U.S. PATENT DOCUMENTS

| | | | |
|---|---|---|---|
| 2011/0298643 A1* | 12/2011 | Kapusta, Jr. | H03F 3/45183 330/296 |
| 2015/0055803 A1* | 2/2015 | Qutub | G10L 25/48 381/111 |
| 2015/0086043 A1* | 3/2015 | Sridharan | H04R 3/00 381/111 |
| 2015/0110290 A1* | 4/2015 | Furst | H04R 3/04 381/98 |
| 2015/0333743 A1* | 11/2015 | Singh | H03K 19/09432 327/299 |
| 2016/0241961 A1* | 8/2016 | Josefsson | H03G 5/005 |
| 2017/0142519 A1* | 5/2017 | Lasseuguette | H04R 19/04 |
| 2017/0150261 A1* | 5/2017 | Conso | H04R 3/06 |
| 2018/0308511 A1* | 10/2018 | Dai | H04R 3/00 |

* cited by examiner

ADAPTIVE CONTROL OF BIAS SETTINGS IN A DIGITAL MICROPHONE

PRIORITY APPLICATION

This application claims the benefit of and priority to U.S. Provisional Application No. 63/090,386, filed Oct. 12, 2020, the content of which application is hereby incorporated by reference herein in its entirety.

BACKGROUND

Commonplace digital microelectromechanical system (MEMS) microphones usually implement two modes of operation, either a functional mode having signal bandwidth in a range from about 5 KHz to about 10 KHz (such a mode referred to as low-power mode) or another functional mode having a signal bandwidth in a range from about 12 KHz to about 30 KHz (such a mode referred to as a high-quality mode). That is, one mode optimized for high quality operation (e.g., low noise, low distortion, and higher dynamic range) and another mode for low quality operation (e.g., low power, lower bandwidth, and lower dynamic range). Each one of those functional modes can be optimized for minimum power consumption based on maximum signal frequency and clock frequency. While the signal frequency limit can be fixed for each one of those functional modes, the clock frequency can vary significantly. A signal path of the digital MEMS microphone can be biased such that the digital MEMS microphone supports a maximum allowed clock frequency for a functional mode. As a result, the digital MEMS microphone can consume excessive power when the clock frequency utilized during operation is lower than that maximum allowed clock frequency.

Therefore, much remains to be improved in existing technologies for bias control of signal-path components in digital microphones. Accordingly, improved technologies for control of bias settings in digital microphones may be desired.

SUMMARY

The following presents a simplified summary of one or more of the embodiments in order to provide a basic understanding of one or more of the embodiments. This summary is not an extensive overview of the embodiments described herein. It is intended to neither identify key or critical elements of the embodiments nor delineate any scope of embodiments or the claims. The sole purpose of this Summary is to present some concepts of the embodiments in a simplified form as a prelude to the more detailed description that is presented later.

In an embodiment, the disclosure provides a device. The device includes a first component that provides data indicative of a clock frequency of operation in a functional mode of a digital microphone. The clock frequency clocks one or more microphone components having switching activity. For purposes of illustrations, switching activity refers to time-dependent transitions between at least two states of one or more circuit elements, where functionality provided by a component including the circuit element(s) results from switching activity. The device also includes a second component that determines, using the clock frequency, an amount of bias current to supply to at least a first microphone component of the one or more microphone components. The device further includes a memory device that retains control parameters that include at least one of a first subset of parameters defining a relationship between current and frequency and a second subset of parameters defining a quantization of the relationship. The quantization includes multiple bias current levels for respective frequency intervals.

In another embodiment, the disclosure provides a method. The method includes supplying, by a first component of a digital microphone, data indicative of a clock frequency of operation in a functional mode of the digital microphone. The clock frequency clocks one or more microphone components having switching activity. The method also includes determining, by a second component of the digital microphone, using the clock frequency, an amount of bias current to supply to at least a first microphone component of the one or more microphone components. The determining including receiving parameters defining a quantization of a relationship between the bias current and the clock frequency, where the quantization includes multiple bias current levels for respective frequency intervals; selecting a first bias current level corresponding to a particular frequency interval of the respective frequency intervals that includes the clock frequency; and configuring the amount of bias current to the selected first bias current level.

In yet another embodiment, the disclosure provides a digital microphone that includes a processing device. The processing device includes a first component that provides data indicative of a clock frequency of operation in a functional mode of the digital microphone. The clock frequency clocks one or more microphone components having switching activity. The device also includes a second component that determines, using the clock frequency, an amount of bias current to supply to at least a first microphone component of the one or more microphone components. The digital microphone further includes a microelectromechanical microphone die coupled to the circuit and configured to receive an acoustic wave. The circuit configured to generate a signal representative of the acoustic wave.

In still another embodiment, the disclosure provides a device. The device includes a first component that provides data indicative of a clock frequency of operation in a functional mode of a digital microphone. The clock frequency clocks one or more microphone components having switching activity. The device also includes a second component that determines, using the clock frequency, an amount of bias current to supply to at least a first microphone component of the one or more microphone components.

Other embodiments and various examples, scenarios and implementations are described in more detail below. The following description and the drawings set forth certain illustrative embodiments of the specification. These embodiments are indicative, however, of but a few of the various ways in which the principles of the specification may be employed. Other advantages and novel elements of the embodiments described will become apparent from the following detailed description of the specification when considered in conjunction with the drawings.

DETAILED DESCRIPTION

The disclosure recognizes and addresses, in at least some embodiments, the issue of bias control of signal-path processing components and other types of components having switching activity within a digital microphone. Power consumption and low noise are among the performance metrics of digital microphones. Digital microphones can operate in various functional modes in order to optimize at least those performance metrics. The digital microphones can be configured to support a wide range of clock frequencies for operation in one or several functional modes. Each function mode can be designed to support the maximum clock frequency in such a range, with ensuing higher power consumption. Thus, a digital microphone can consume excessive power when the clock frequency utilized during operation is less than that maximum clock frequency.

Embodiments of this disclosure can avoid such inefficiency by, for example, providing control of bias settings of signal-path processing components and/or other components having switching activity that are present in a digital microphone. In some cases, the control of the bias settings can rely on determining a clock frequency of operation in a functional mode of the digital microphone, and then configuring an amount of bias current based on a magnitude of the clock frequency. The amount of bias current can be configured to provide a satisfactory level of power for operation in the functional mode. The control of bias settings can be adaptive in that the clock frequency can be monitored for changes and, in response to detecting a transition from the clock frequency to a new clock frequency, the amount of bias current can be adjusted based on the new clock frequency. Such an adjustment can be automatic, without reliance on signaling from a host device and/or an agent that operates the digital microphone. As a result, in sharp contrast to conventional microphones, embodiments of this disclosure permit operating a defined number of functional modes while optimizing the power consumption for each functional mode based on an actual magnitude of the clock frequency and not on a preset magnitude.

Although embodiments of this disclosure are described with reference to digital microelectromechanical microphones, the disclosure is not limited in that respect. Indeed, the principles of this disclosure also can be applied to digital microphones having other types of sensing elements and to analog microphones that operate under variable frequency.

Figure 1:
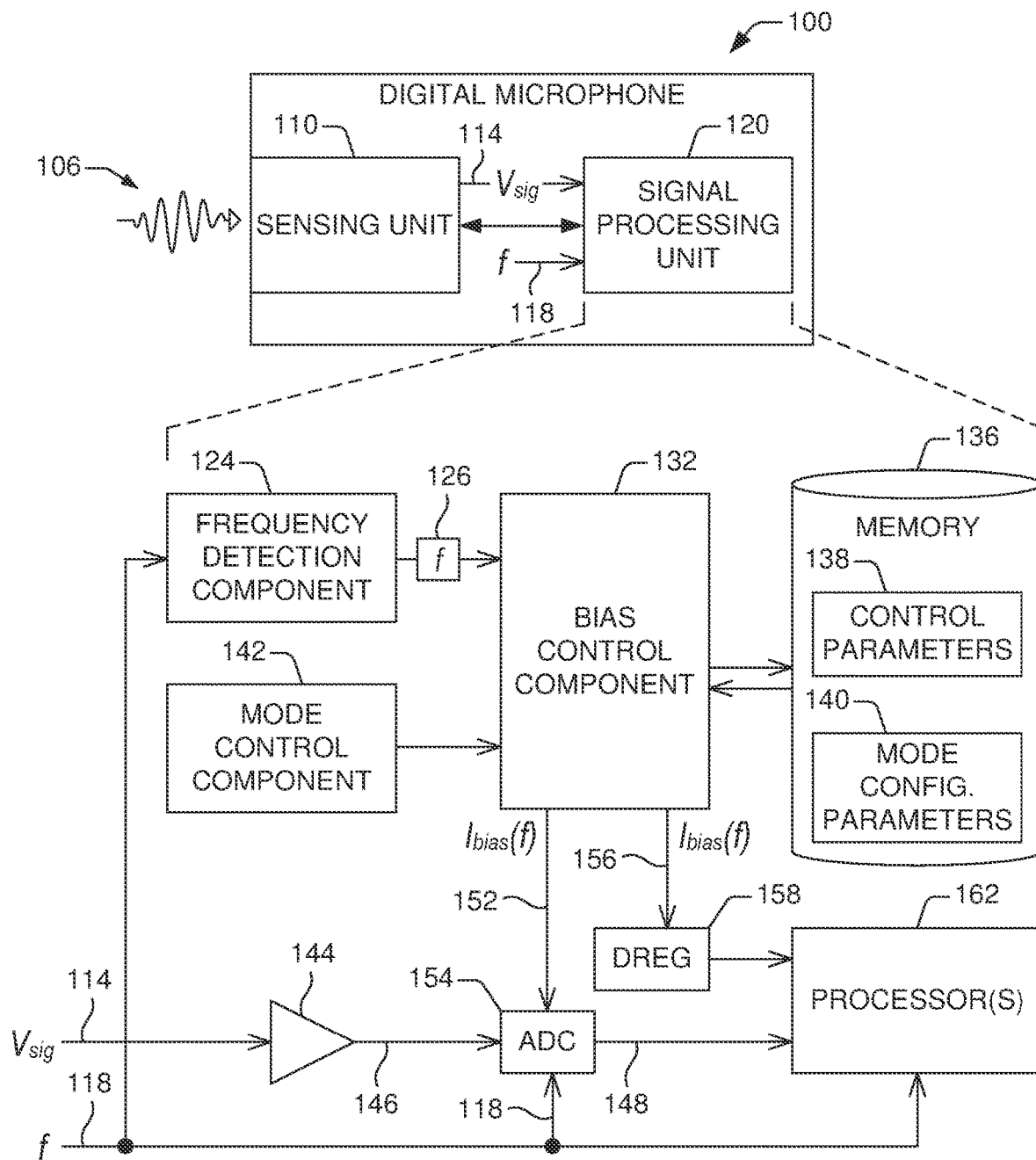
FIG. 1 illustrates an example of a digital microelectromechanical microphone, in accordance with one or more embodiments of this disclosure.

With reference to the drawings, FIG. 1 illustrates an example of a digital microelectromechanical microphone 100 in accordance with one or more embodiments of this disclosure. As is illustrated, the digital microelectromechanical microphone 100 includes a sensing unit 110 that can receive an acoustic wave 106 propagating an acoustic signal that includes an audible signal or an ultrasonic signal, or both. The sensing unit 110 can generate an electric output signal 114 (denoted by $V_{sig}$) in response to receiving the acoustic wave 106. The electric output signal 114 generally is an analog electric signal, such as a voltage, and represents the acoustic signal propagated by the acoustic wave 106.

In some embodiments, the sensing unit 110 can generate the electric output signal 114 by means of capacitive or piezoelectric sensing. Accordingly, the electric output signal 114 is an analog electric signal that can be embodied in a single-ended output signal or a differential output signal. To generate the electric output signal 114, in those embodiments, the sensing unit 110 can include a microelectromechanical system (not depicted in FIG. 1) that can be embodied in a microelectromechanical die including a movable plate (e.g., a flexible diaphragm) and stationary plate(s) (e.g., one or several backplates). The movable plate and the stationary plate(s) serve as respective electrodes, and permit generating a capacitive signal in response to deformation caused by the pressure wave 106 upon impinging on the movable plate, for example. To that point, the sensing unit 110 also can include a voltage source device (such as a charge pump) or another type of circuitry (neither depicted in FIG. 1) that can bias such electrodes.

The digital microelectromechanical microphone 100 also includes a signal processing unit 120 that is functionally coupled (e.g., electrically coupled) to the sensing unit 110. The signal processing unit 120 can receive and operate on the electric output signal 114 to generate a digital signal representative of the acoustic signal sensed by the sensing unit 110. The digital signal can include a single stream of bits or many streams of bits (e.g., a stream for audible signal and another stream for ultrasonic signal). As such, the signal processing unit 120 can include one or several signal processing pathways, each including at least one signal processing component. A signal processing component can be referred to as a signal-path processing component and can be embodied in, or can constitute, a component that includes one or several circuit elements having switching activity. The signal processing unit 120 also can include other components, each including one or several circuit elements having switching activity. Those other components, individually or collectively, also can permit signal processing. A voltage regulator (digital or analog) is an example of those other components.

At least one of the signal-path processing components present in the signal processing unit 120 can be clocked by a clock signal 118 defining a clock waveform of frequency f (a positive real number). The frequency f can be referred to as clock frequency f. The frequency f can be used as a frequency of operation in a functional mode of the digital electromechanical microphone 100. In some cases, as is illustrated in FIG. 1, the signal processing unit 120 can receive the clock signal 118 from an external component (not depicted in FIG. 1), such as an oscillator device, another type of timing circuitry, or a codec device. In other cases, the signal processing unit 120 can include a component that generates the clock signal 118. In some embodiments, one or more of the signal-path processing component(s) can be clocked by one or more second clock signals having respective frequencies different from the frequency f.

The signal processing unit 120 can contain multiple components, including one or several amplifiers; signal-path processing components; one or several processors, each having at least one processing core; memory devices; one or several multiplexers; a combination of the foregoing; or similar elements. In some embodiments, the signal processing unit 120 can be assembled within a single computing chipset or device. In other embodiments different sections of the signal processing unit 120 can be assembled within respective chipsets or devices. For instance, each signal processing pathway within the signal processing unit 120 can be assembled in a chipset or device. Regardless of its specific architecture, at least two of the components that constitute the signal processing device can be functionally coupled by means of a bus architecture (e.g., a control bus and a data bus).

As is illustrated in FIG. 1, in some embodiments, the signal processing unit 120 includes an amplifier 144 that can receive the electric output signal 114 and can then generate a second electric output signal 146 using the electric output signal 114. The second electric output signal 148 also can be analog. The amplifier 144 can send or otherwise supply the second electric output signal 148 to an analog-to-digital converter (ADC) 154 also included in the signal processing unit 120. The ADC 154 can generate a digital signal 148 representative of the second electric output signal 146. The ADC 154 can utilize the clock signal 118 to sample the electric output signal 114 at a sampling frequency equal to the clock frequency f. The ADC 154 can send or otherwise supply the digital signal 148 to one or several processors 162 for further processing.

The digital microelectromechanical microphone 100 can operate in a particular functional mode M of several functional modes. Those functional modes include, for example, a low-power mode (LPM), a high-quality mode (HQM), and an ultrasonic mode (USM) for example. The digital microelectromechanical microphone 100 can contain mode configuration parameters 140 that are specific to that particular mode. The mode configuration parameters 140 can include one or several default bias settings defining, for example, respective amounts of bias currents. The mode configuration parameters 140 also can include one or several signal clock frequencies corresponding to respective data rates of the functional mode M (e.g., LPM, HQM, or USM). For example, two signal clock frequencies can be defined for HQM: 2.4 MHz and 3.072 MHz. As another example, two other signal clock frequencies can be defined for LPM: 768 kHz and 600 kHz. As yet another example, a signal clock frequency equal to 4.8 MHz can be defined for USM. The mode configuration parameters 140 can be retained in one or more memory devices 136 (referred to as memory 136). The memory 136 can be embodied in at least one non-volatile memory device or at least one volatile memory device, or a combination of both. In some embodiments, the memory 136 can integrated into the signal processing unit 120.

The signal processing unit 120 can include a mode control component 142 that can obtain at least some of the mode configuration parameters 140, including a default bias setting corresponding to a functional mode. The mode control component 142 can send or otherwise supply the mode configuration parameters 140 to a bias control component 132 also included in the signal processing unit 120, as part of configuration of the signal processing unit 120 for operation in the functional mode. Although not depicted in FIG. 1, the mode control component 142 is functionally coupled to the memory 136.

Because the default bias setting can be configured to attain a satisfactory signal-to-noise ratio (SNR) at a particular signal clock frequency of a functional mode M, the power consumed by the signal processing unit 120 at the default bias setting can be excessive for the clock frequency f of the clock signal 118 in some situations. Thus, in contrast to commonplace digital microphones, rather than using the default bias setting during operation in the functional mode M, the signal processing unit 120 can adaptively configure an amount of bias current based on the clock frequency f.

To that end, in some embodiments, the signal processing unit 120 can include a frequency detection component 124 that can determine a magnitude of the clock frequency f.

Specifically, the frequency detection component 124 can include circuitry that receives the clock signal 118 as input signal. As mentioned, the clock signal 118 defines a clock waveform having the clock frequency f. The circuitry can measure the clock frequency f using the clock waveform, in response to receiving clock signal 118. In addition, the frequency detection component 124 can supply data 126 indicative of the clock frequency f. As is illustrated in FIG. 1, the frequency detection component 124 can send or otherwise supply the data 126 to the bias control component 132. In some cases, the data 126 can be sent or otherwise supplied to the bias control component 132 as the data 126 becomes available—e.g., in essentially real-time or periodically, with a period dictated by an execution time of a cycle to determine the magnitude of the clock frequency f. The data 126 can be formatted as a word spanning a defined number of bits (e.g., 4 bits, 8 bits, 16 bits, or 32 bits).

The bias control component 132 can receive the data 126 and can determine, using the data 126, if the clock frequency f has changed relative to a prior clock frequency determined using previously received data 126. In some cases, the bias control component 132 can determine that the clock frequency f has remained the same. Consequently, the bias control component 132 can implement a delay cycle prior to receiving and processing a new data 126. To that end, in some embodiments, the bias control component 132 can include delay circuitry that permits implementing a delay $\Delta t$ of a defined magnitude. As an example, the defined magnitude can correspond to a few to several periods 1/f. Accordingly, in some cases, the defined magnitude can be in a range from about 0.1 μs to about 100 μs. In other cases, the delay cycle can be extended up to 1 s or 2 s, for example, in order to lessen power consumption.

In other cases, the bias control component 132 can determine that the clock frequency f has changed relative to the prior clock frequency. As a result, the bias control component 132 can then determine an amount of bias current to supply to a signal-path processing component of the digital microelectromechanical microphone 100 based on the clock frequency f. To that point, the memory 136 can retain control parameters 138 defining one or several quantizations of respective relationships between current and frequency. Each one of the defined quantization(s) includes multiple bias current levels (or amounts) for respective frequency intervals. As an example, a first relationship of the respective relationships includes one of a linear function, a piecewise linear function, or a polynomial function. In some embodiments, the control parameters 138 can be retained in a memory device (e.g., register(s) or a buffer) integrated into the bias control component 132.

More specifically, the bias control component 132 can determine the amount of bias current by receiving the data 126 and identifying the clock frequency f from the data 126. In addition, the bias control component 132 can receive a subset of the control parameter 138 from the memory 136. The subset of the control parameters 138 defines a particular quantization of a relationship between bias current and frequency. The subset of the control parameters 138 can include at least one parameter. The relationship can include one of a linear function, a piecewise linear function, or a polynomial function, for example. Similar to other quantizations retained in the memory 136, that particular quantization includes multiple bias current levels (or amounts) for respective frequency intervals. The bias control component 132 can then select a first bias current level corresponding to a particular frequency interval of the respective frequency intervals, where the particular frequency interval includes the clock frequency f. Further, the bias control component 132 can configure the amount of bias current to the selected first bias current level.

In some embodiments, the bias control component 132 can obtain a subset of the control parameters 138 defining the relationship between bias current and clock frequency. In one example, the relationship can be a polynomial function of the clock frequency (denoted by $\upsilon$): $I_{bias}(\upsilon) = a_0 + a_1\upsilon + \ldots + a_l\upsilon^l$, where $l$ is the degree of the polynomial function. Thus, instead of obtaining control parameters that define a quantization, the bias control component 132 can obtain the parameters $\{a_0, a_1, \ldots, a_l\}$ and can then determine the amount of bias current using the parameter(s) and clock frequency f, by evaluating the polynomial function at $\upsilon = f$.

After determining an amount of bias current 152 for the ADC 154, at the clock frequency f of the clock signal 118, the bias control component 132 can supply the amount of bias current 152 to the ADC 154. The amount of bias current 152 is denoted as $I_{bias}(f)$ in FIG. 1.

Figure 2:
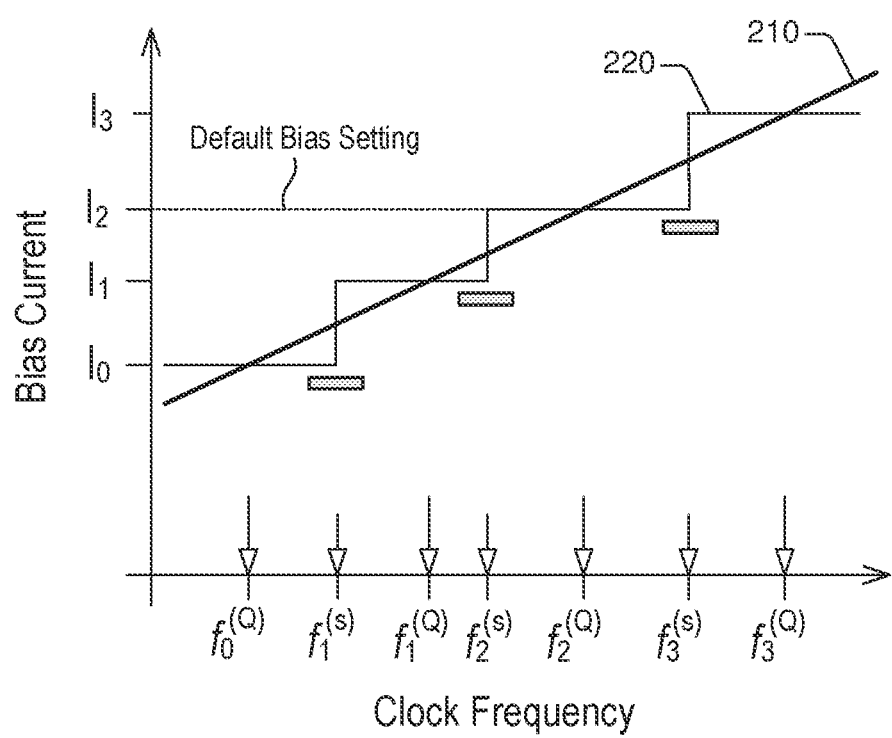
FIG. 2 illustrates an example of a relationship between bias current and clock frequency and an example of a quantization of that relationship, in accordance with one or more embodiments of this disclosure.

Simply as an illustration, FIG. 2 presents an example of a relationship 210 between bias current and clock frequency for a component having switching activity, and an example of a quantization 220 of that relationship. The component can be one of a signal-path processing component, a voltage regulator, or a similar component. The relationship 210 can represent an optimal SNR function, which is shown as a linear function. The relationship 210, however, is not limited to a linear function and, in some cases, can be embodied in piecewise linear function or a polynomial function. The optimal SNR function can be determined by a computational simulation of the settling delay of the component having switching activity. Such a simulation can be a computer-aided design (CAD) circuit simulation of a circuit including the component (e.g., an ADC) or the component itself. The quantization 220 can be defined by identifying multiple quantization frequencies $f_0^{(Q)}, f_1^{(Q)}, \ldots,$ and $f_{N-1}^{(Q)}$ within the domain of clock frequencies over which the relationship 210 is defined. Here, N is a natural number greater than unity. Each one of the multiple quantization frequencies can be used to define a respective bias current level in the quantization 220. For a quantization frequency, the bias current level can be defined as the amount of bias current dictated by the relationship 210. To further define the quantization 220, an interval of clock frequencies corresponding to a bias current level can be configured. To that point, switching frequencies $f_1^{(s)}, f_2^{(s)}, \ldots,$ and $f_{N-1}^{(s)}$ defining respective transitions between adjacent bias current levels can be configured. The case N=4 is shown in FIG. 2 simply for purposes of illustration.

Because the relationship 220 represents an optimal SNR function, the quantization 210 results in frequency intervals of lower SNR near switching frequencies. Thus, switching frequencies can be configured to be distant from defined clock frequencies (also referred to as key sampling frequencies) of an operational mode and to have sufficient frequency threshold hysteresis in the adaptive bias algorithm. A defined clock frequency may be a required clock frequency of the operational mode. In some configurations, a switching frequency can be centered between two defined clock frequencies (e.g., required clock frequencies). Such a configuration can be referred to as on-center configuration. Configurations that have a switching frequency off-center between defined switching frequencies might yield less power saving. Here, frequency threshold hysteresis means a frequency threshold is different if the frequency is increasing or decreasing. Frequency threshold hysteresis can avoid repeatedly randomly switching an amount of bias current in situations where the clock frequency is near the threshold. A frequency threshold hysteresis value can be greater than random noise or interference to the threshold detection. For purposes of illustration, the frequency intervals of lower SNR are illustrated with segments parallel to the abscissa in FIG. 2.

In some cases, at least one of the quantization frequencies can be equal to respective signal clock frequencies corresponding to one or several functional modes. In the quantization 220, the bias current level corresponding to a first quantization frequency that is equal to a signal clock frequency can be the same as the default bias setting for that functional mode. In one example, $f_1^{(Q)}=2.4$ MHz and $f_2^{(Q)}=3.072$ MHz—which are signal clock frequencies of HQM—and $I_2$ is equal to the default bias setting for HQM. In that example, the following switching frequencies can be defined: $f_2^{(s)}=2.6$ MHz and, $f_1^{(s)}=2.0$ MHz. In another example, $f_2^{(Q)}=600$ kHz and $f_3^{(Q)}=768$ MHz—which are signal clock frequencies of LPM—and $I_2$ is equal to the default bias setting for LPM. In that example, the quantization frequency $f_1^{(Q)}=300$ kHz also can be defined along with the following switching frequency: $f_2^{(s)}=684$ kHz. In yet another example, $f_3^{(Q)}=4.8$ MHz corresponding to a signal clock frequency of USM. In that example, the following switching frequency can be defined: $f_3^{(s)}=3.9$ MHz.

Figure 3:
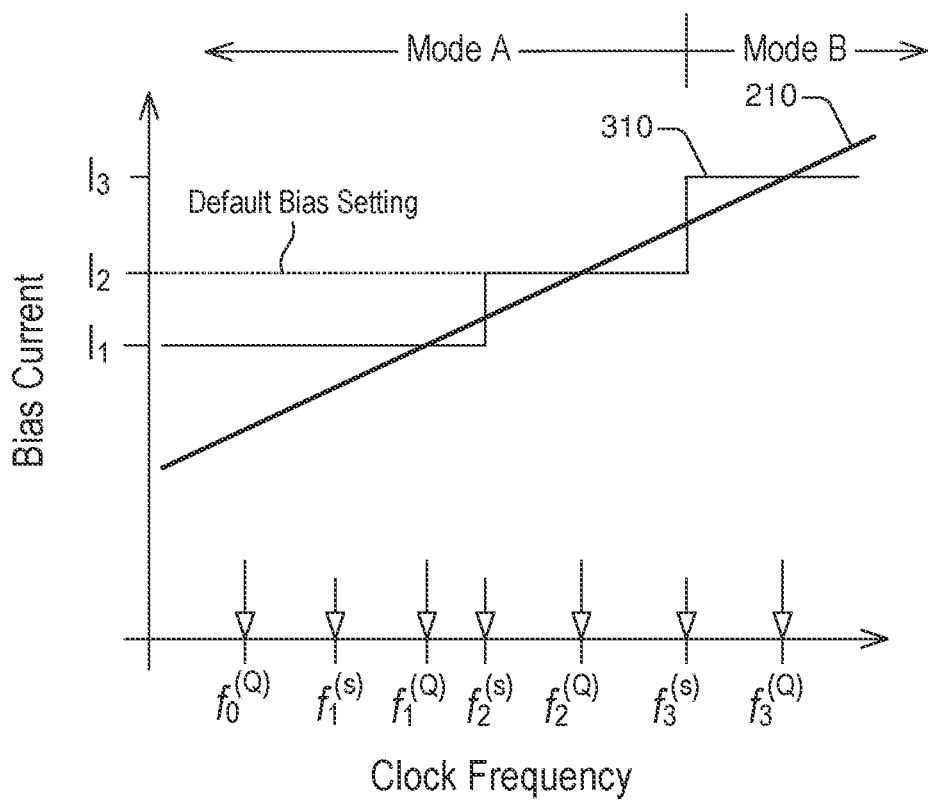
FIG. 3 illustrates another example of a quantization of the relationship between bias current and clock frequency that is shown in FIG. 2, in accordance with one or more embodiments of this disclosure.

The relationship 210 can be quantized in other ways. As an illustration, as is shown in FIG. 3, a quantization 310 of the relationship 210 includes a switching frequency corresponding to a transition from a first functional mode to a second functional mode. The first and second functional modes are denoted as Mode A and Mode B, respectively, simply for the sake of nomenclature. The quantization 310 also can include a single bias current level or dual bias current level for a functional mode. Specifically, the quantization 310 includes a bias current level $I_3$ for Mode B (e.g., USM), and a first bias current level $I_2$ and a second bias current level $I_1$ for Mode A. In one example, Mode A and Mode B can be HQM and USM, respectively. In that example, $I_3$ corresponds to the amount of bias current for 4.8 MHz; $I_2$ correspond to the default bias setting for HQM; and $I_1$ corresponds to the amount of bias current for 2.4 MHz.

Figure 4:
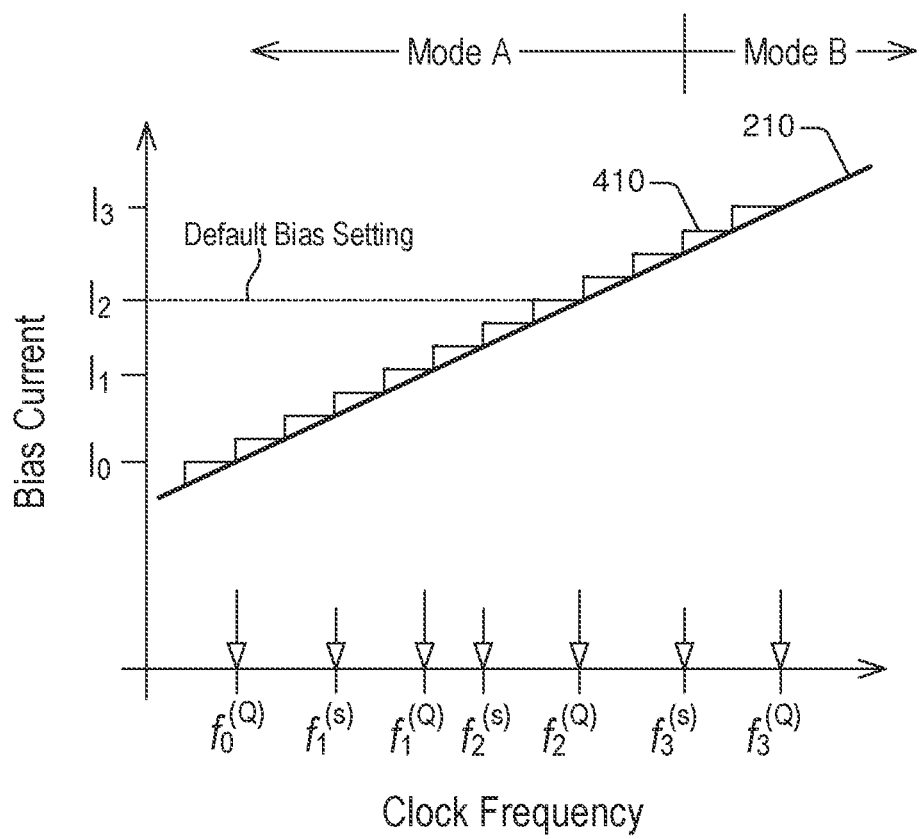
FIG. 4 illustrates yet another example of a quantization of the relationship between bias current and clock frequency that is shown in FIG. 2, in accordance with one or more embodiments of this disclosure.

As another illustration, as is shown in FIG. 4, a quantization 410 of the relationship 210 can include a number of switching points that is limited by the bias resolution of a signal-path processing component being biased (e.g., ADC 154). Again, in case Mode A and Mode B are HQM and USM, respectively, $I_3$ corresponds to the amount of bias current for 4.8 MHz; $I_2$ correspond to the default bias setting for HQM; and $I_1$ corresponds to the amount of bias current for 2.4 MHz.

Figure 5:
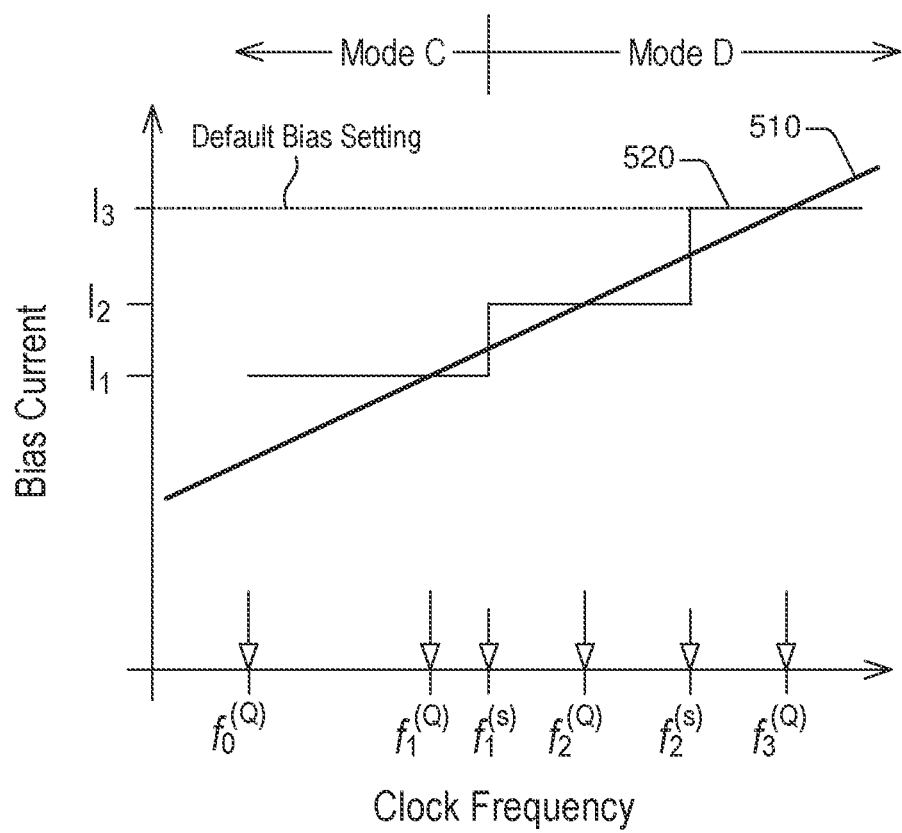
FIG. 5 illustrates another example of a relationship between bias current and clock frequency and an example of a quantization of that relationship, in accordance with one or more embodiments of this disclosure.

Different functional modes can have different default bias settings and frequencies defining respective transitions between adjacent functional modes. Accordingly, a relationship between bias current and clock frequency (and a corresponding quantization) can be specific to a functional mode. As yet another illustration, FIG. 5 illustrates a relationship 510 between bias current and frequency, and a quantization 520 of that relationship. In an example case in which the functional mode is LPM, the quantization 510 can include a switching frequency $f_1^{(s)}$ that defines a transition between a first functional mode and a second functional mode. The first and second functional modes are denoted as Mode C and Mode D, respectively, simply for the sake of nomenclature. In that example, the quantization 510 also includes $f_2^{(Q)}=600$ kHz and $f_3^{(s)}=768$ kHz. A bias current level $I_3$ is equal to the default bias setting for Mode D (e.g., standard LPM (S-LPM)). A bias current level $I_1$ corresponds to a bias current level for Mode C (e.g., ultra-low power mode (U-LPM)).

The bias control component 132 (FIG. 1) also can adaptively configure, using the clock frequency f, an amount of bias current for other types of components having switching activity besides an ADC. In some cases, the bias control component 132 can use the clock frequency f to adaptively configure an amount of bias current for one or several components that supply power to other components with switching activity. As is illustrated in FIG. 1, those other components can include a digital voltage regulator (DREG) 158 that supplies power to at least one of the processor(s) 162. To that end, the bias control component 132 can receive a subset of the control parameters 138 that defines a particular quantization of a relationship between bias current and clock frequency. The subset can include at least one parameter. The relationship and the particular quantization can be specific to the DREG 158. Similar to other quantizations described herein, that particular quantization includes multiple bias current levels (or amounts) for respective frequency intervals. The bias control component 132 can then select a first bias current level corresponding to a particular frequency interval of the respective frequency intervals, where the particular frequency interval includes the clock frequency f. Further, the bias control component 132 can configure the amount of bias current to the selected first bias current level.

After determining an amount of bias current 156 for the DREG 158, at the clock frequency f of the clock signal 118, the bias control component 132 can supply the amount of bias current 156 to the ADC 154. The amount of bias current 156 is also denoted as $I_{bias}(f)$ in FIG. 1.

Figure 6:
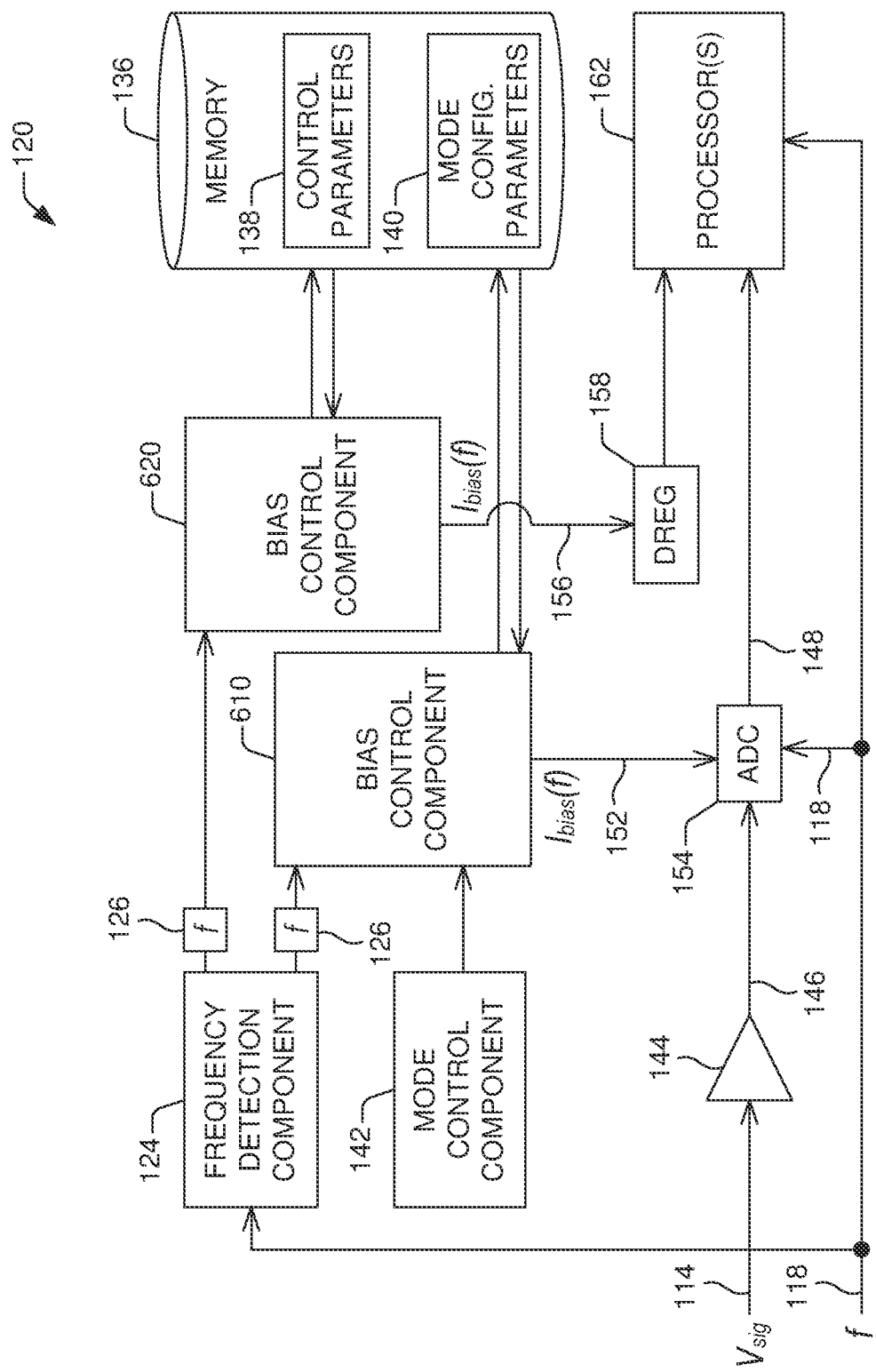
FIG. 6 illustrates an example of a signal processing unit included in a digital microelectromechanical microphone, in accordance with one or more embodiments of this disclosure.

In some embodiments, the signal processing unit 120 can include multiple bias control components, each adaptively configuring a bias setting for a respective signal-path processing component or another type of component having switching activity. As is illustrated in FIG. 6, the signal processing unit 120 can include a first bias control component 610 that can adaptively configure, using the clock frequency f, the amount of bias current 152 for the ADC 154. The first bias control component 610 operates in the same fashion as the bias control component 132, in accordance with aspects described herein. The signal processing unit 120 also can include a second bias control component 620 that can adaptively configure, using the clock frequency f, the amount of bias current 156 for the DREG 158. The second bias control component 620 operates in the same fashion as the bias control component 132, in accordance with aspects described herein. Although not depicted in FIG. 6, the mode control component 142 is functionally coupled to the memory 136 and the second bias control component 620.

The adaptive configuration of bias settings based on the clock frequency f need not rely on the control parameters 138 retained in the memory 136. In some embodiments, the bias control component 132 (FIG. 1) can include circuitry configured to supply an amount of bias current for a signal-path processing component, or another type of component having switching activity, without obtaining control parameters from the memory 136 or another type of memory device. Thus, in some configurations, the bias control component 132 can include first circuitry configured to supply a first amount of bias current for a component having switching activity (e.g., ADC 154). The bias control component 132 also can include second circuitry configured to supply a second amount of bias current to a component that supplies power (e.g., DREG 156). In other configurations, that first circuitry and second circuitry can embody, or can constitute, the bias control component 610 (FIG. 6) and the bias control component 620 (FIG. 6), respectively. In the foregoing configurations neither the first circuitry nor the second circuitry obtains control parameters from a memory device. Indeed, in those configurations, the memory 136 need not include the control parameters 138.

Figure 7A:
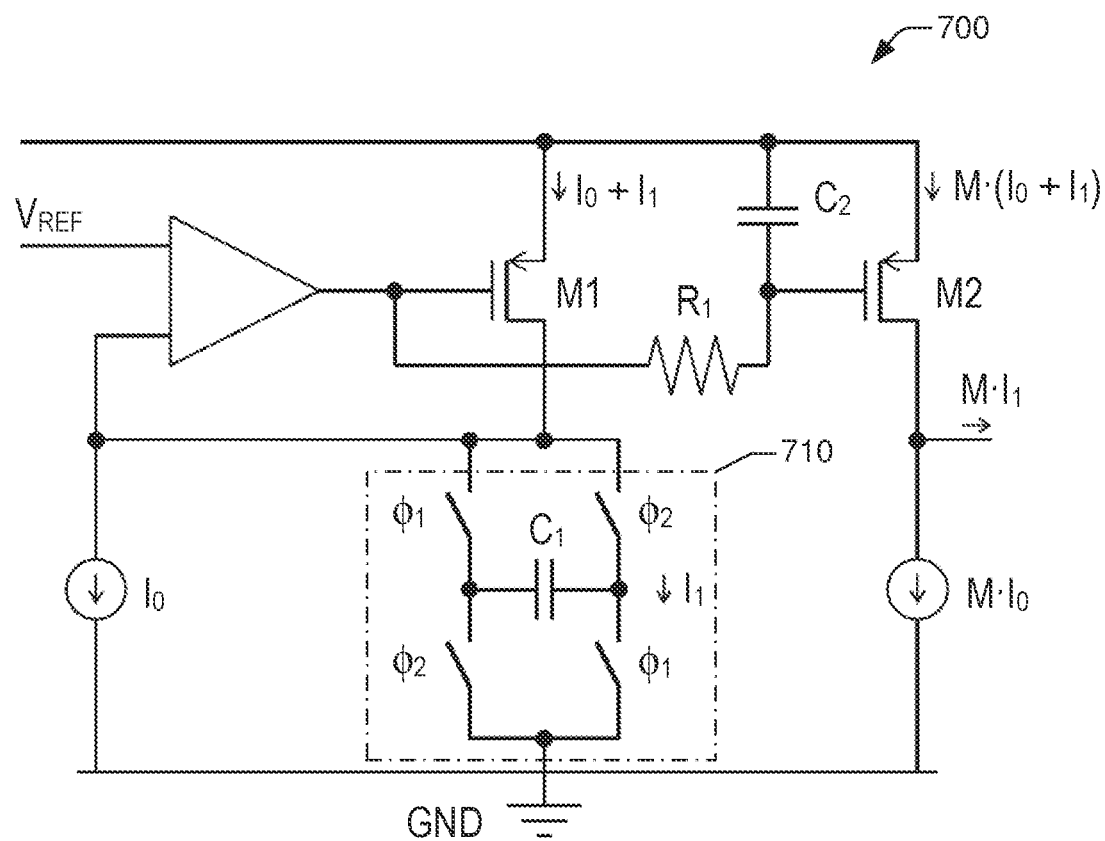
FIG. 7A illustrates an example of circuitry that can supply, based on clock frequency, an amount of bias current to a component having switching activity, in accordance with one or more embodiments of this disclosure.

In some embodiments, a bias control component of the signal processing unit 120 need not rely on control parameters 138 retained in the memory 136. Indeed, the memory 136 may not be present in the signal processing unit 120 in those embodiments, or when present, the memory 136 may not contain the control parameters 138. As an illustration, in those embodiments, such a bias control component can be embodied in, or can include, circuitry that can supply an amount of bias current to one or more microphone components having switching activity. The amount of bias current that is supplied (e.g., the bias setting) to the microphone components can be based on clock frequency (e.g., clock frequency f). More specifically, FIG. 7A illustrates an example of circuitry 700 that can supply an amount of bias current to an ADC based on the clock frequency f of the clock signal 118. The circuitry 700 can embody, or can constitute, the first circuitry that is contained in a bias control component and is described above. The circuitry 700 embodies an analog frequency-to-current converter, and the amount of bias current that is supplied can be proportional to the clock frequency f. The circuitry 700 includes a switched circuit 710. The two terminals of capacitor $C_1$ alternatingly switch between $V_{REF}$ and ground (GND) at the clock frequency f, with $V_{REF}$ switching polarity during the clock period 1/f. Accordingly, the capacitor $C_1$ is charged by $Q_1=2C_1V_{REF}$. The resulting average current supplied by $M_1$ is $I_1=4C_1V_{REF}f$. A quiescent current $I_0$ can be used to pre-bias a transistor $M_1$, in some cases, for more stable performance of the frequency-to-current converter. The circuitry 700 includes a low-pass filter having a resistor $R_1$ and a capacitor $C_2$ that provides low-pass filtered gate control of the transistor $M_1$. The low-pass filtered gate of the transistor $M_1$ can be used to control the gate of a transistor $M_2$. As a result, the circuitry 700 can provide a scaled replica of the drain current of $M_1$. The scale factor applied to the drain current is denoted as M in FIG. 7A. The quiescent portion of the drain current of the transistor $M_2$ is equal to $M \cdot I_0$ and can be removed from the net current of $M_2$, resulting in a current $M \cdot I_1$ that can serve as a bias current for a component with switching activity, such as the ADC 154.

Simply as an illustration, $V_{REF}$ can range from about 0.6 V to about 1.2 V; f can range from about 24 kHz to about 4 MHz; and each one of $C_1$ and $C_2$ can range from about 0.1 pF to about 20 pF. In addition, the desired range of $M \cdot I_1$ can extend from about 1 μA to about 20 uA for block with switching activity, in accordance with aspects described herein.

Figure 7B:
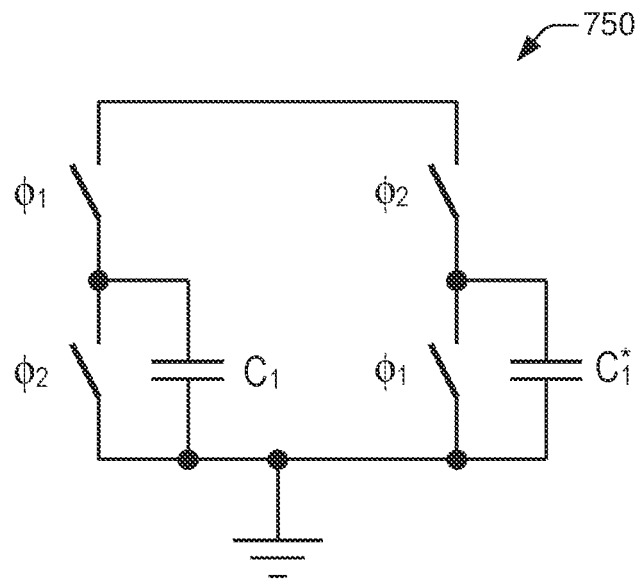
FIG. 7B illustrates another example of a switched circuitry that can be included in the circuitry shown in FIG. 7A.

FIG. 7B illustrates an example of an alternative switched circuit 750 that can replace the switched circuit 710 shown in FIG. 7A. In operation, the capacitor $C_1$ is charged to $V_{REF}$ during the first phase of the clock signal. In the second clock phase (e.g., $\phi_2$) of the clock signal, the capacitor polarity is reversed, denoted as $C_1$* in FIG. 7B, and the capacitor $C_1$ is charged again to $V_{REF}$. The first phase of the clock signal is a switching signal and is denoted by $\phi_1$. The second phase of the clock signal also is a switching signal and is denoted by $\phi_2$. The period of each one of $\phi_1$ and $\phi_1$ is equal to 1/(2f). Magnitude of respective switching rates of $\phi_1$ and $\phi_2$ can be in a range from about 24 kHz to about 4 MHz.

Figure 8A:
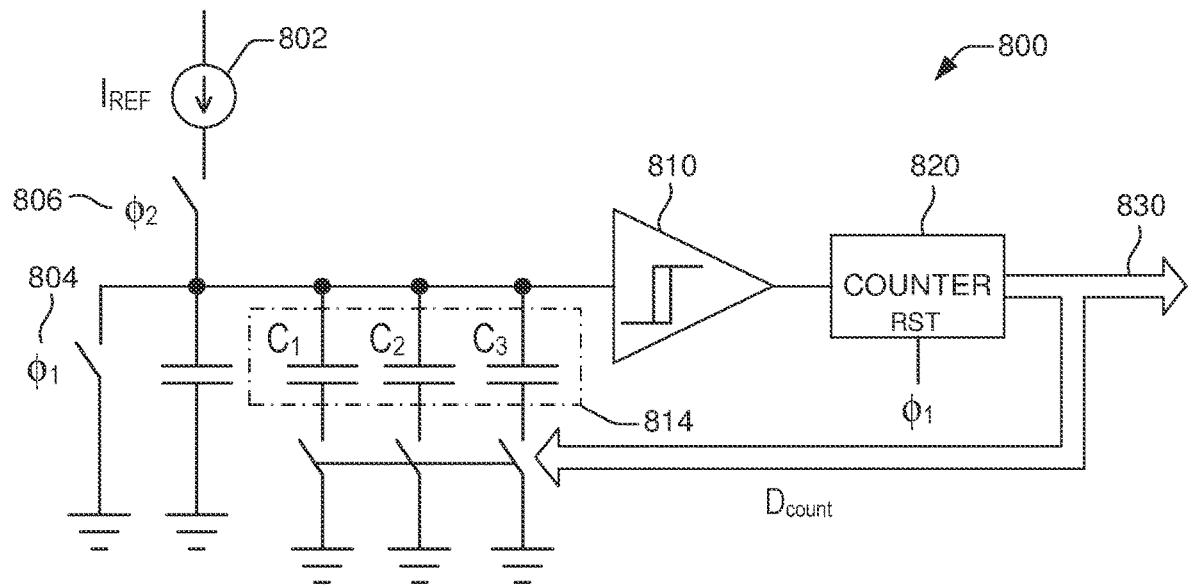
FIG. 8A illustrates an example of circuitry that can determine data indicative of a clock frequency supplied to a signal processing unit included in a digital microelectromechanical microphone, in accordance with one or more embodiments of this disclosure.
Figure 8B:
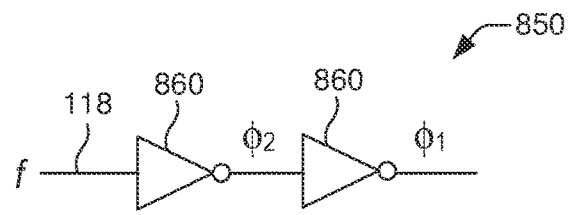
FIG. 8B illustrates an example of circuitry that supplies first and second switching signal to the circuitry shown in FIG. 8A.

FIG. 8A illustrates an example of circuitry 800 than can embody, or can constitute, the frequency detection component 124 (FIG. 1). The circuitry 800 can generate data 830 indicative of the clock frequency f of the clock signal 118 (FIG. 1). In some cases, the data 830 embodies the data 126 (FIG. 1). The circuitry 800 relies on a reference current 802 (denoted $I_{REF}$ in FIG. 8A) that is clocked by a clock signal having the clock frequency f, and on two switching signals, a first switching signal 804 and a second switching signal 806. Similar to what is described with respect to the example circuitry 700, the first and second switching signals represent respective clock phases of the clock signal. The first switching signal 804 and the second switching signal 806 are denoted as $\phi_1$ and $\phi_2$, respectively, simply for the sake of nomenclature. As is shown in FIG. 8B, the first switching signal 806 that is supplied to the circuitry 800 can be generated using a first inverter 860, and the second switching signal 806 that is supplied to the circuitry 800 can be generated using a second inverter 860 applied to $\phi_2$.

The circuitry 800 includes a capacitor bank 814 having multiple capacitors that can be charged by $I_{REF}$. Although three capacitors $C_1$, $C_2$, and $C_3$ are shown, the disclosure is not limited in that respect. Indeed, the capacitor bank 814 can include a greater or lesser number of capacitors. The charging of the capacitor bank 814 can be controlled by a counter 820 that generates a count according to signal received from a comparator 810. The counter 820 resets according to $\phi_1$. A time constant of the circuitry 800 can be determined by the effective capacitance $C_{eff}$ of the charged capacitor bank 814 and $I_{REF}$. Both $C_{eff}$ and $I_{REF}$ can be controlled by the counter 820. More specifically, $I_{REF}$ can be a digital-to-current controlled source (e.g., a binary weighted DAC) that is controlled directly by a digital output of the counter. A value Dcount of the counter after the end of period T=1/f is proportional to the clock frequency f; namely, $f=1/V_{th} \Sigma_{k=1}^{Dcount} C_k$, where $V_{th}$ is the threshold of the comparator 810. That is, in cases that the circuitry 800 starts with the smallest time constant—e.g., $C_1$ is less than $C_2$ and $C_3$—the counter 820 can continue increasing the time constant (that is, charging $C_2$ and/or $C_3$) while the comparator 810 detects that the threshold $V_{th}$ has not been crossed before the end of the period T.

Figure 9A:
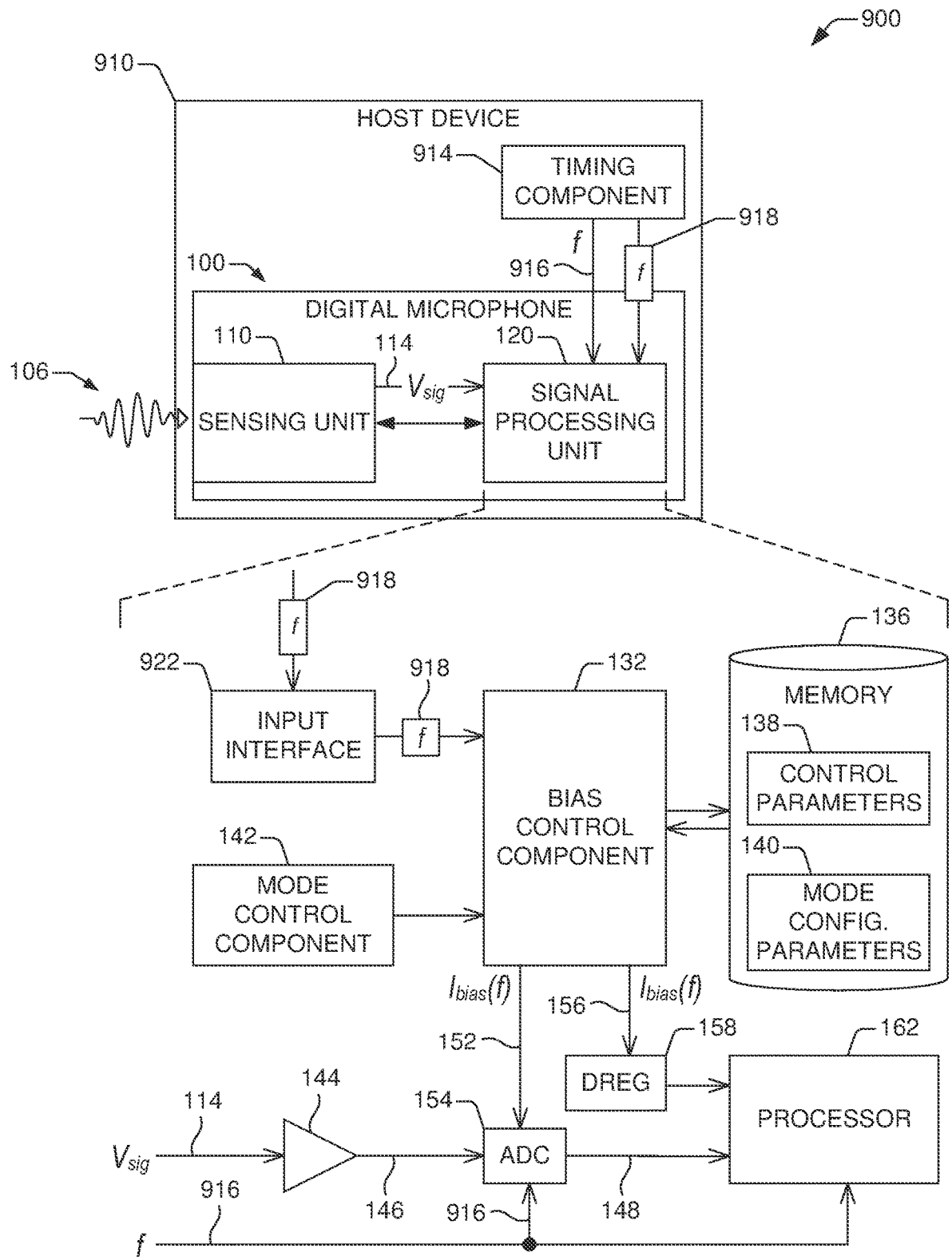
FIG. 9A illustrates an example of an operational environment that includes a digital electromechanical microphone, in accordance with one or more embodiments of this disclosure.

FIG. 9A illustrates an example of an operational environment 900 that includes the digital electromechanical microphone 100, in accordance with one or more embodiments of this disclosure. The operational environment 900 includes a host device 910 that has a timing component 914 that can provide a clock signal 916 having a clock frequency f to the signal processing unit 120. The timing component 914 also can provide data 918 indicative of the clock frequency f. The data 918 can be formatted as a word spanning a defined number of bits. Although not shown in FIG. 9A, the host device 910 also includes other components that can provide specific functionality of the host device 910. The other components can include, for example, hardware, software, firmware, or a combination thereof.

The signal processing unit 120 shown in FIG. 9A can include an input interface 922, such as a pin or another type of input port. The input interface 922 can receive the data 918 from the host device 910 and can then send or otherwise supply the data 918 to the bias control component 132. In some embodiments, the input interface 922 can be included in the frequency detection component 124 (FIG. 1). Although the input interface 922 is shown in FIG. 9 as being external to the bias control component 132, the input interface 922 can be integrated into the bias control component 132 in some embodiments.

The bias control component 132 can receive the data 918 and can then determine, using the clock frequency f, one or more amounts of bias current for respective signal-path processing components or other components having switching activity, in accordance with aspects described hereinbefore.

Figure 9B:
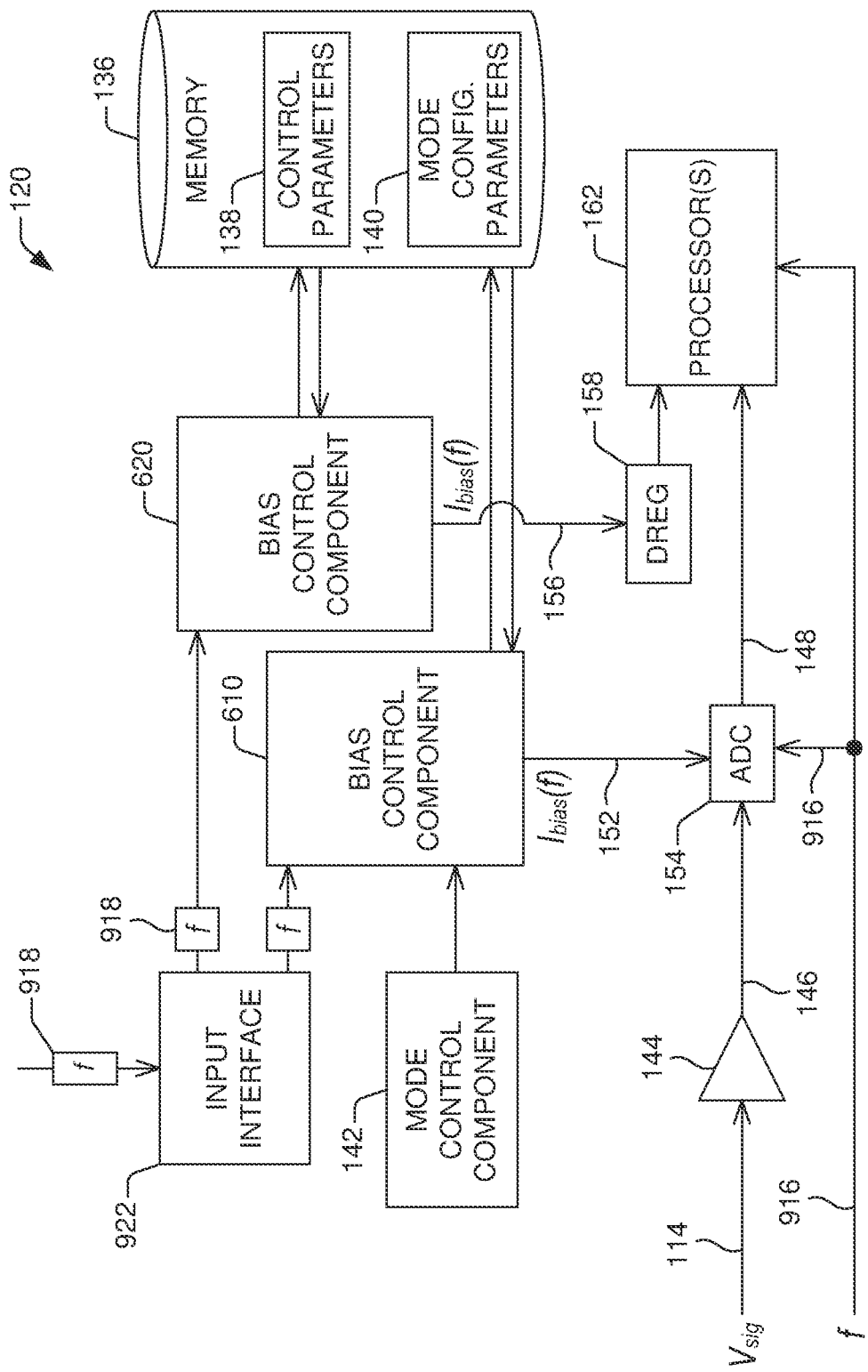
FIG. 9B illustrates an example of a signal processing unit included in a digital microelectromechanical microphone within the operational environment shown in FIG. 9A, in accordance with one or more embodiments of this disclosure.

FIG. 9B illustrates an example of the signal processing unit 120 included in a digital microelectromechanical microphone 100 within the operational environment 900 (FIG. 9A). In that example, the signal processing unit 120 can include the bias control component 610 and the bias control component 620 that control, respectively, the ADC 154 and the DREG 158, in accordance with aspects described herein.

Figure 10A:
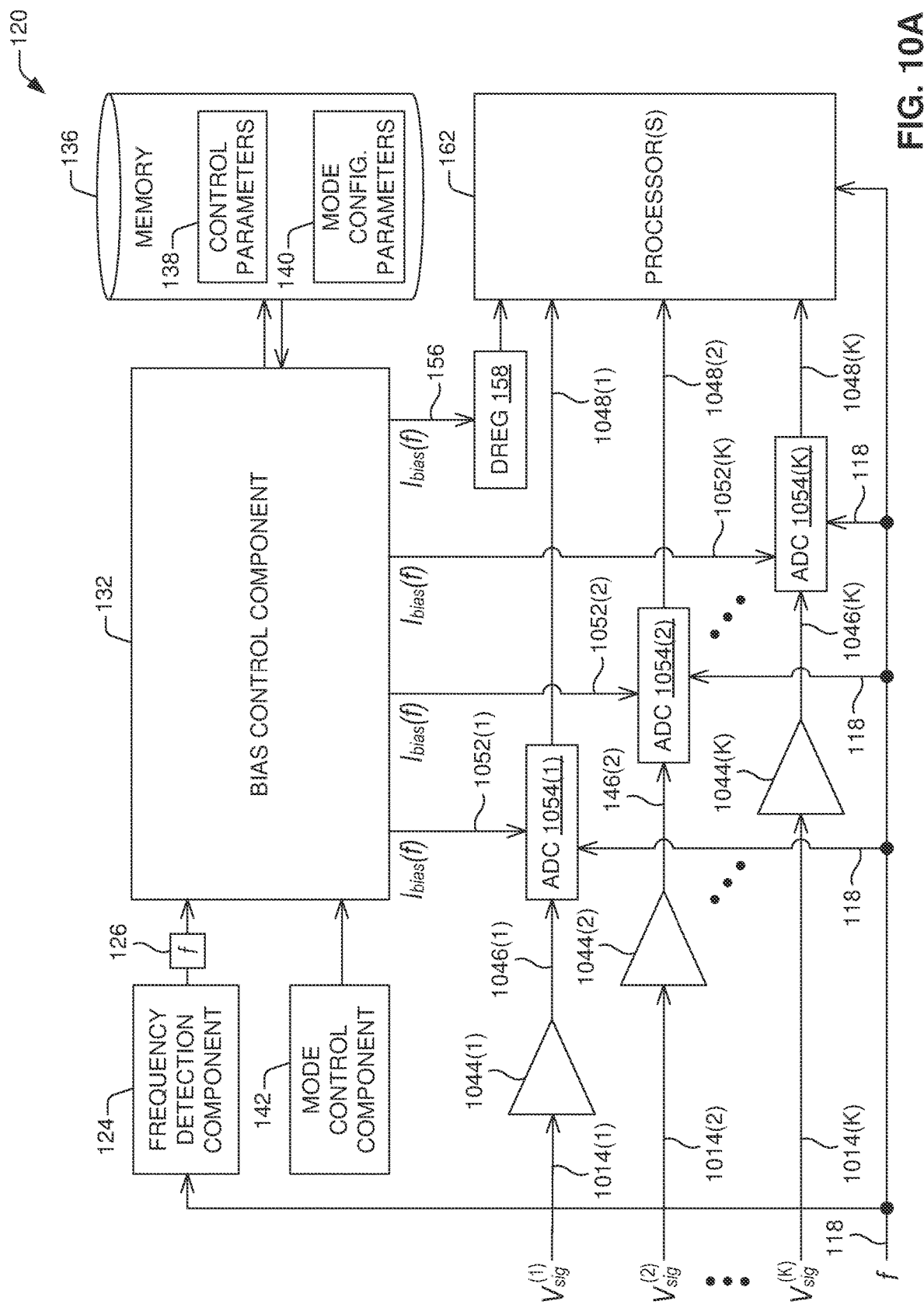
FIG. 10A illustrates an example of a signal processing unit included in a digital microelectromechanical microphone, in accordance with one or more embodiments of this disclosure.

The digital electromechanical microphone 100 (FIG. 1) is not limited to generating a single electric output signal in response to receiving the pressure wave 106. In some embodiments the sensing unit 110 can be configured to generate different types of electric output signal depending on the acoustic signal propagated by the pressure wave 106 or a mode of operation, or both. Accordingly, as is illustrated in FIG. 10A, the signal processing unit 120 can include multiple signal pathways corresponding to respective types of electric output signal. Specifically, the signal processing unit 120 can include a first signal pathway corresponding to a first type of electric output signal 1014(1) (denoted as $V_{sig}^{(1)}$), a second signal pathway corresponding to a second type of electric output signal 1014(2), (denoted as $V_{sig}^{(2)}$), and so continuing up to an K-th signal pathway corresponding to an K-th type of electric output signal 1014(K), (denoted as $V_{sig}^{(K)}$), Here, K is a natural number greater than unity. Although K is represented as being greater than two, the disclosure is not so limited. Indeed, in some embodiments, K can be equal to 2.

Simply as an illustration, in one embodiment, three signal pathways (K=3) can be assembled in the signal processing unit 120 shown in FIG. 10A: The first signal pathway corresponding to the first type of electric output signal 1014(1); the second signal pathway corresponding to the second type of electric output signal 1014(2); and a third signal pathway corresponding to a third type of electric output signal 1014(3). More specifically, the first and second type of electric output signal can represent an audible signal, where the first signal pathway pertains to a first mode of operation (e.g., LPM) and the second signal pathway pertains to a second mode of operation (e.g., HQM). The third type of electric signal can represent an ultrasonic signal, where the third signal pathway pertains to a third mode of operation (e.g., USM).

Figure 10B:
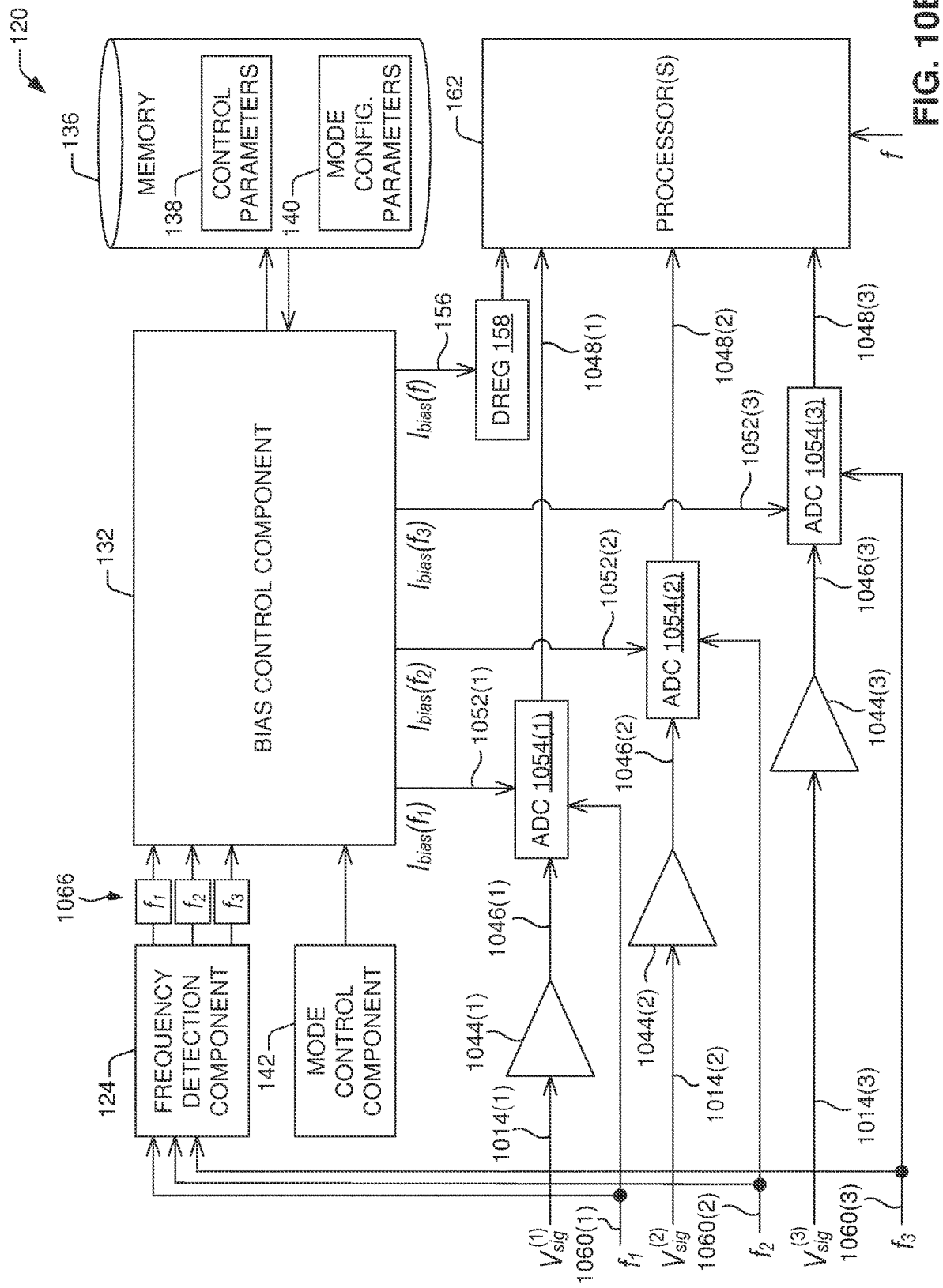
FIG. 10B illustrates another example of a signal processing unit included in a digital microelectromechanical microphone, in accordance with one or more embodiments of this disclosure.

As is shown in FIG. 10A, each one of the signal pathways can include a component having switching activity, where the component is clocked by the clock signal 118 having the clock frequency f. For a signal pathway p (1, 2, . . . , or K), such a component can be embodied in an ADC 1054(p). In other cases, as is shown in FIG. 10B, several clock signals can clock respective components having switching activity, each of the respective component included in a respective signal pathway. For the purposes of illustration, in the case, K=3, a first clock signal 1060(1) having a frequency $f_1$ can clock the ADC 1054(1), a second clock signal 1060(2) having a frequency $f_2$ 1060(2) can clock the ADC 1054(2), and a third clock signal 1060(3) having a frequency $f_3$ 1060(1) can clock the ADC 1054(3). Each one of the frequencies $f_1$, $f_2$, and $f_3$ represents a sampling frequency and can be generated by a timing component (not depicted in FIG. 10B) that can be external to the signal processing unit 120 or integrated into the signal processing unit 120. Simply for the sake of illustration, the DREG 158 and the processor(s) 162 are clocked by a clock signal having the clock frequency f. The disclosure is not limited in that respect, however, and in some cases, clock signals having other respective clock frequencies can clock the DREG 158 and the processor(s) 162. The frequency detection component 124 can receive the first clock signal 1060(1), the second clock signal 1060(2), and the third clock signal 1060(3) and can send data 1066 including first data indicative of $f_1$, second data indicative of $f_2$ and third data indicative of $f_3$.

Regardless of the number of signal pathways assembled in the signal processing unit 120, the bias control component 132 can adaptively configure, using the clock frequency f, bias settings for respective components having switching activity. To that end, in some embodiments, the control parameters 138 can include subsets for respective ones of ADC 1054(1), ADC 1054(2), . . . , and ADC 1054(M). The bias control component 132 can obtain a first subset of the subsets, where the first subset corresponds to the first ADC 1054(1), for example. The bias control component 132 can then determine an amount of bias current for the first ADC 1054(1) using control parameters in the first subset and the clock frequency f. The bias control component 132 also can obtain a second subset of the subsets, where the second subset corresponds to the second ADC 1054(2), for example. The bias control component 132 can then determine an amount of bias current for the second ADC 1054(2) using second control parameters included in the second subset and the clock frequency f. The bias control component 132 can obtain other subsets of the subsets present in the control parameters 138. For each of those other subsets, the bias control component 132 can determine an amount of bias current for respective ones of the remaining ADCs, up to ADC 1054(K). Thus, the bias control component 132 can determine multiple amounts of bias current for respective ADCs included in the signal processing component 120. For instance, the bias control component 132 can determine a first amount of bias current 1052(1) for the ADC 1054(1); a second amount of bias current 1052(2) for the ADC 1054(2); and continuing up to a K-th amount of current 1052(M) for the ADC 1054(K).

Figure 11:
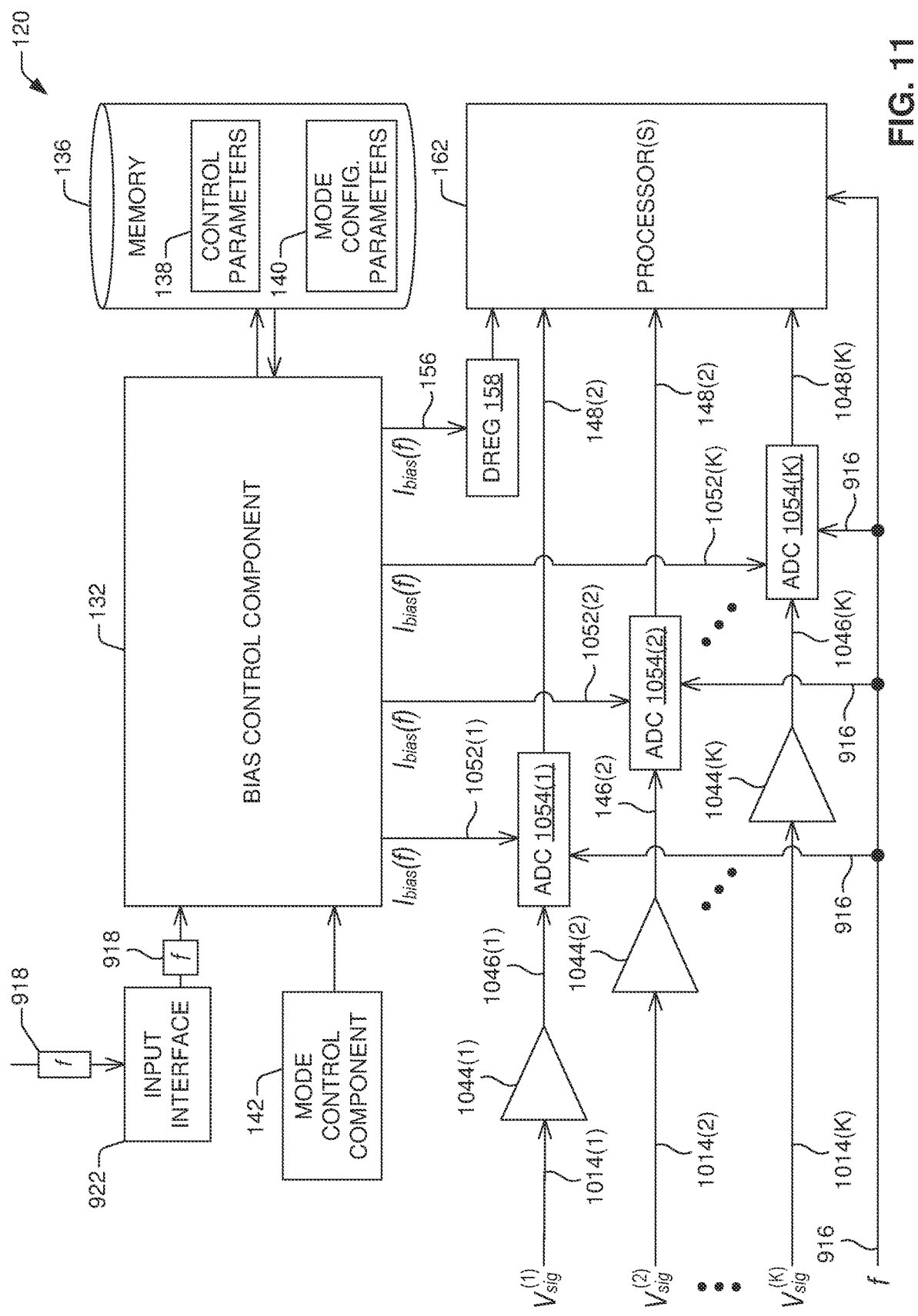
FIG. 11 illustrates another example of a signal processing unit included in a digital microelectromechanical microphone, in accordance with one or more embodiments of this disclosure.

In some embodiments, as is shown in FIG. 11, the signal processing component 120 can receive data 918 indicative of a clock frequency f of the clock signal 916 instead of detecting the clock frequency f by means of the frequency detection component 124 (FIG. 10A, for example). To that end, in those embodiments, the signal processing component 120 can include the input interface 922 (e.g., a pin or another type of input port) that receives the data 918 and passes/sends/supplies the data 918 to the bias control component 132.

The disclosure is not limited to the one-to-many control configuration shown in FIG. 10 and FIG. 11, where the bias control component 132 can adaptively configure respective bias settings for multiple signal-path processing components (e.g., ADC 1054(1), ADC 1054(2), . . . , and ADC 1054(M)). In some embodiments, several bias control components providing the functionality of the bias control component 132 can adaptively configure bias settings of the multiple signal-path processing components. Accordingly, a first bias control component can adaptively configure a bias setting of a first signal-path processing component of the multiple signal-path processing components, and a second bias control component can adaptively configure a bias setting of a second signal-path processing component of the multiple signal-path processing components.

Figure 12:
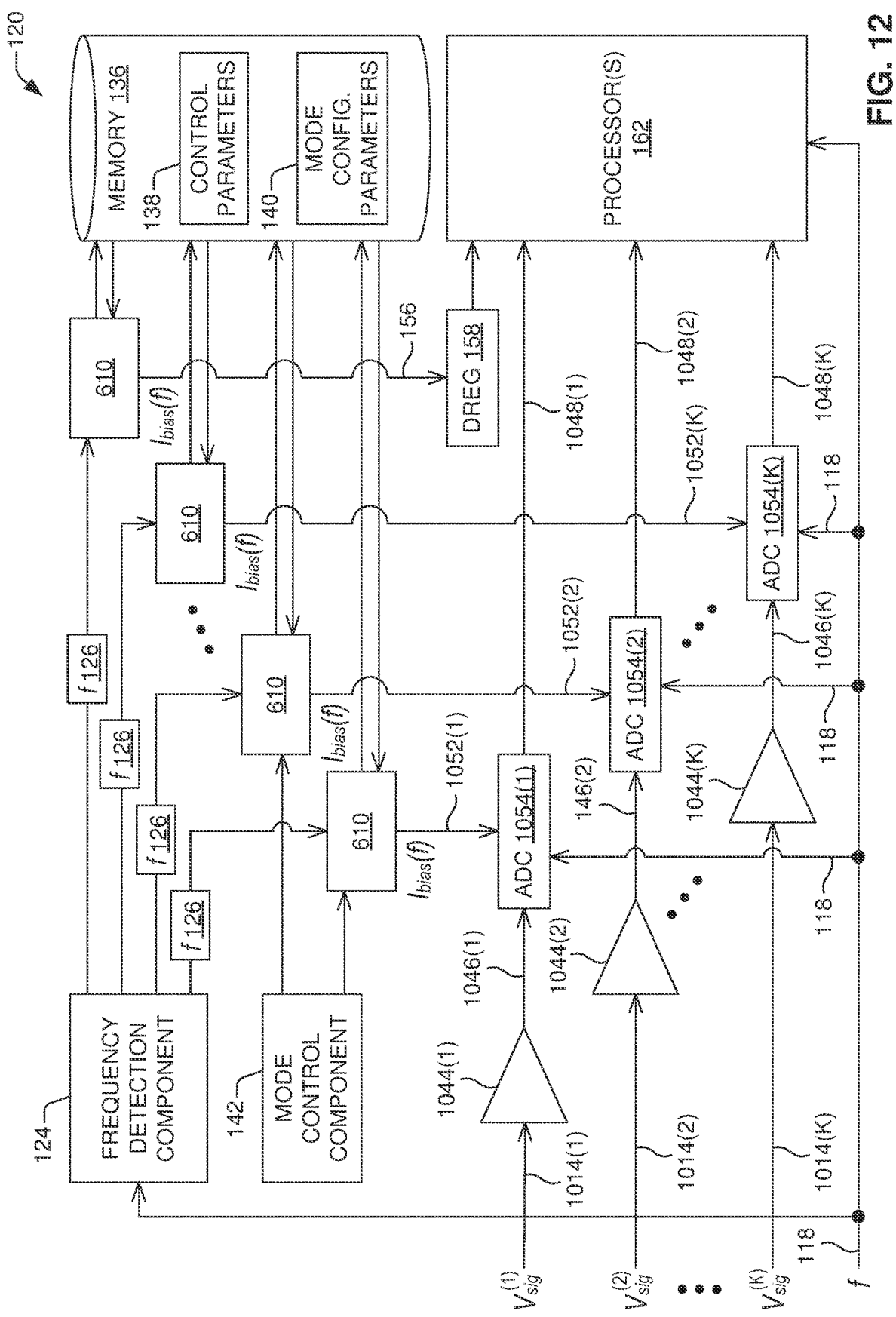
FIG. 12 illustrates yet another example of a signal processing unit included in a digital microelectromechanical microphone, in accordance with one or more embodiments of this disclosure.

In some cases, as is shown in FIG. 12, the signal processing unit 120 can be assembled in a one-to-one control configuration where a first bias control component 610 can adaptively configure an amount of bias current for the first ADC 1054(1) based on the clock frequency f of the clock signal 118; a second bias control component 610 can adaptively configure an amount of bias current for the second ADC 1054(2) based on the clock frequency f; continuing in such a fashion up to an K-th bias control component 610 that can adaptively configure an amount of bias current for the K-th ADC 1054(M) based on the clock frequency f.

Figure 13:
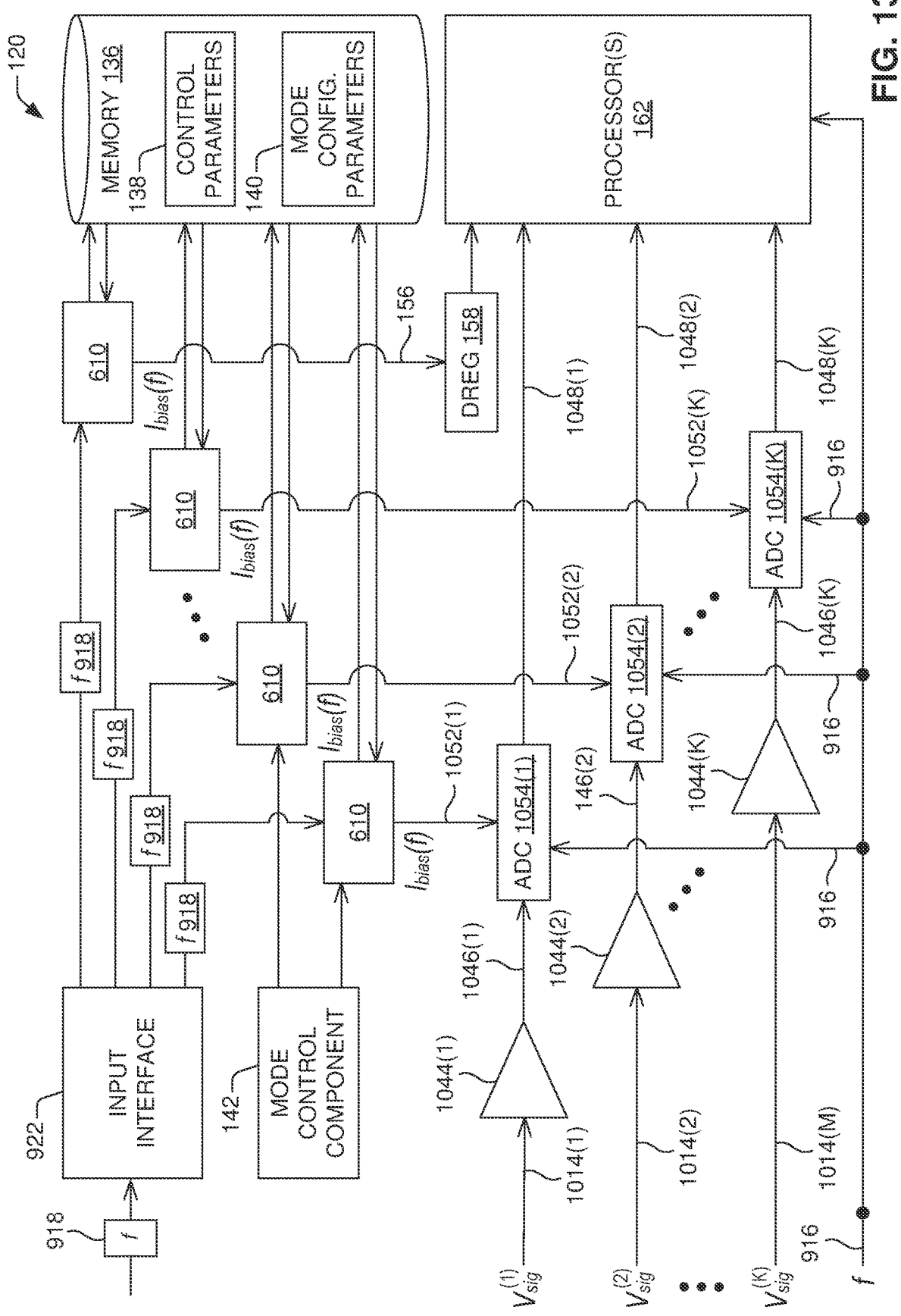
FIG. 13 illustrates a further example of a signal processing unit included in a digital microelectromechanical microphone, in accordance with one or more embodiments of this disclosure.

In some embodiments, as is shown in FIG. 13, the signal processing component 120 can receive data 918 indicative of a clock frequency f of the clock signal 916 instead of detecting the clock frequency f by means of the frequency detection component 124 (FIG. 10A, for example). To that end, in those embodiments, the signal processing component 120 can include the input interface 922 (e.g., a pin or another type of input port) that receives the data 918 and passes/sends/supplies the data 918 to the bias control component 132.

Figure 14:
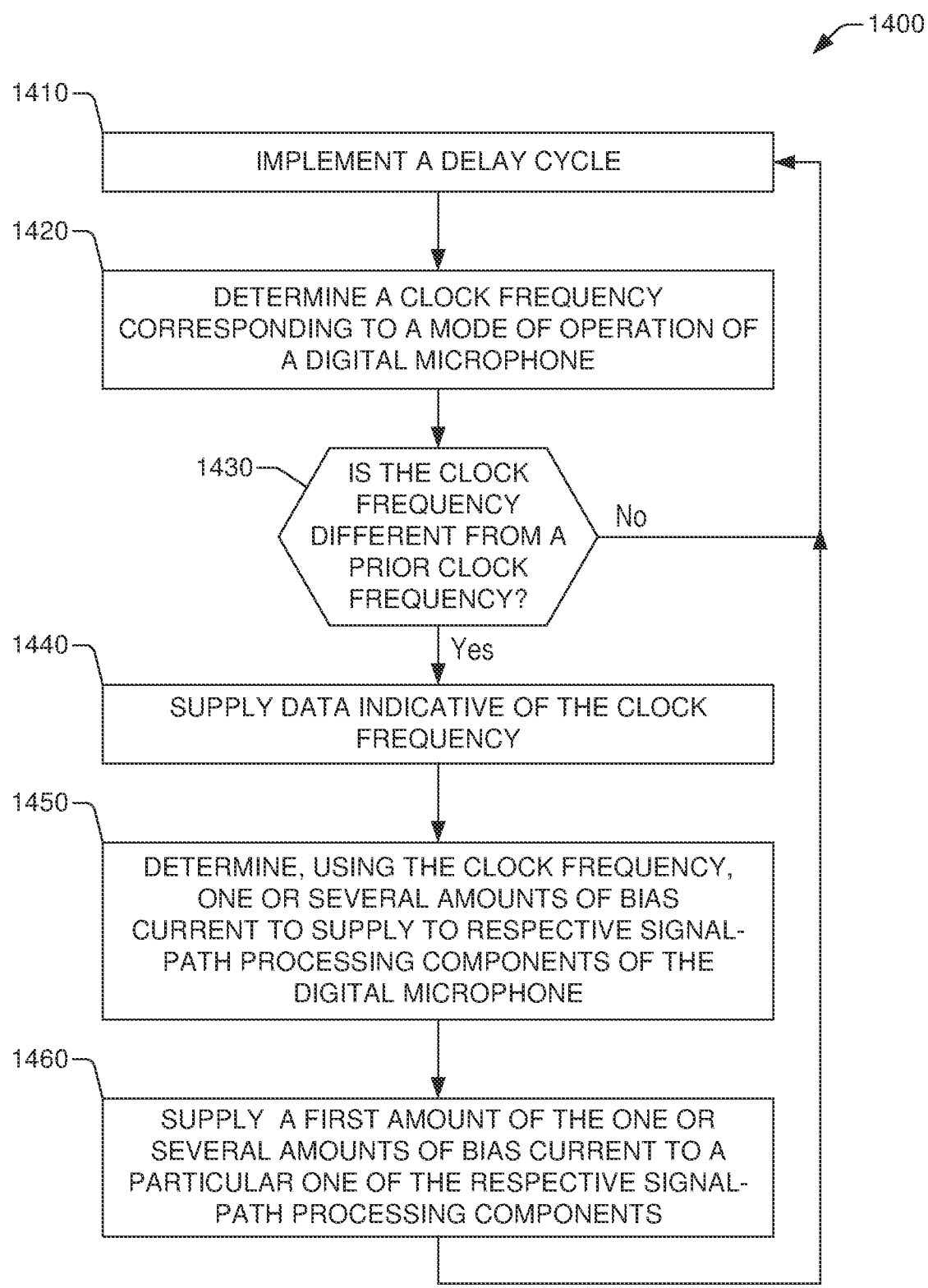
FIG. 14 illustrates an example of a method for providing bias current to a signal-processing path component, in accordance with one or more embodiments of this disclosure.

FIG. 14 illustrates an example of a method 1400 for providing bias current to a signal-processing path component of a digital microphone, in accordance with one or more embodiments of this disclosure. The digital microphone can be embodied in the digital microelectromechanical microphone 100, in some cases. Although the example method 1400 is described in connection with signal-path processing components, the example method 1400 also can be applied to other types of components having switching activity (one or several voltage regulators, for example) and being included in the digital microphone.

At block 1410, a first component can implement a delay cycle. As mentioned, in some cases, the delay cycle can have a duration in a range from about 0.1 μs to about 100 μs. In other cases, power consumption may be reduced by extending the delay cycle up to 1 s or 2 s for example. The first component can be embodied in, or can constitute, the bias control component 132 (FIG. 1, for example) or the bias component 610 (FIG. 6, for example).

At block 1420, a second component of the digital microphone can determine a clock frequency of operation of a functional mode of the digital microphone. The second component can be embodied in, or can constitute, the frequency detection component 124. The clock frequency can be, for example, an external clock frequency that clocks a processor and/or another component having switching activity that can be included in the digital microphone. As is described herein, the clock frequency can be determined in several ways. Specifically, in some embodiments, determining the clock frequency can include receiving, by the second component, an input signal that defines a clock waveform having the clock frequency, and measuring, by the circuit, the clock frequency using the clock waveform. In other embodiments, determining the clock frequency can include receiving, by the circuit, data defining the clock frequency from a host device (e.g., host device 910 (FIG. 9). The data being formatted as a word spanning a defined number of bits.

The block 1410 and block 1420 can be implemented at least partially concurrently. That is, implementation of the delay cycle can overlap, at least partially, with the determination of the clock frequency.

At block 1430, the first component can determine if the clock frequency is different from a prior clock frequency. In response to ascertaining that the clock frequency is not different that the prior clock frequency, the flow of the example method 1400 can return to block 1410, where the delay cycle is implemented again. In the alternative, in response to ascertaining that the clock frequency is different from the prior clock frequency, the flow of the example method 1400 continues to block 1440.

At block 1440, the second component can supply data indicative of the clock frequency. In some embodiments, the data can be supplied to a control component configured to supply bias current to one or several signal-path processing components integrated into the digital microphone. The control component can embodied in, or can constitute, the first component (bias control component 132 (FIG. 1), the bias component 610 (FIG. 6), or the bias component 620 (FIG. 6), for example).

At block 1450, the control component can determine, using the clock frequency, one or several amounts of bias current to supply to respective signal-path processing components of the digital microphone. Determining an amount of bias current can include, in some embodiments, receiving parameters defining a quantization of a relationship between bias current and clock frequency. Examples of the quantization are shown in FIG. 2 and FIG. 3. The quantization includes multiple bias current levels for respective frequency intervals. In some embodiments, the digital microphone includes a memory device that stores the parameters. The memory device can be integrated into the circuit or can be functionally coupled thereto. In some embodiments, the memory device can be embodied in the memory 136 (FIG. 1). In other embodiments, the memory device can be embodied in a buffer or register(s) integrated into the control component. The relationship can include one of a linear function, a piecewise linear function, or a polynomial function, for example.

Determining the amount of bias current also can include selecting a first bias current level corresponding to a particular frequency interval of the respective frequency intervals, where the particular frequency interval includes the clock frequency. In addition, determining the amount of bias current can include configuring the amount of bias current to the selected first bias current level. The control component can determine the one or several amounts of bias current.

As mentioned, the amount of bias current need not be determined using a quantization. In some embodiments, the control component can obtain one or several parameters that define the relationship. In one example, the relationship can be a polynomial function of the clock frequency $\upsilon$, namely, $I_{bias}(\upsilon)=a_0+a_1\upsilon+ \ldots +a_l\upsilon^l$, where l is the degree of the polynomial function. Thus, the control component can obtain the parameters $\{a_0, a_1, \ldots, a_l\}$ and can then determine the amount of bias current using the parameter(s) and clock frequency, by evaluating the relationship at $\upsilon=f$, where f is the determined clock frequency.

At block 1460, the control component can supply a first amount of the one or several amounts of bias current to a particular signal-path processing component of the respective signal-path processing components. The particular signal-path processing component can be embodied in an ADC, for example. The flow of the example method 1400 can then return to block 1410 to continue monitoring clock frequency changes.

As a result of continued monitoring of frequency changes, a change from the clock frequency to a second clock frequency can be detected. Such a chance can occur in response to a change to a second functional model of the digital microphone. In that situation, block 1440 to block 1460 can be implemented for the second clock frequency, in accordance with aspects described hereinbefore. Accordingly, at block 1440, the second component can supply second data indicative of a second clock frequency corresponding to a second mode of operation of the digital microphone. At block 1450, the control component can determine, using the second clock frequency, a second amount of bias current to supply to one or more the signal-path processing components of the digital microphone. At block 1460, the control component can supply the second amount to the particular signal-path processing component of the respective signal path processing components.

Figure 15A:
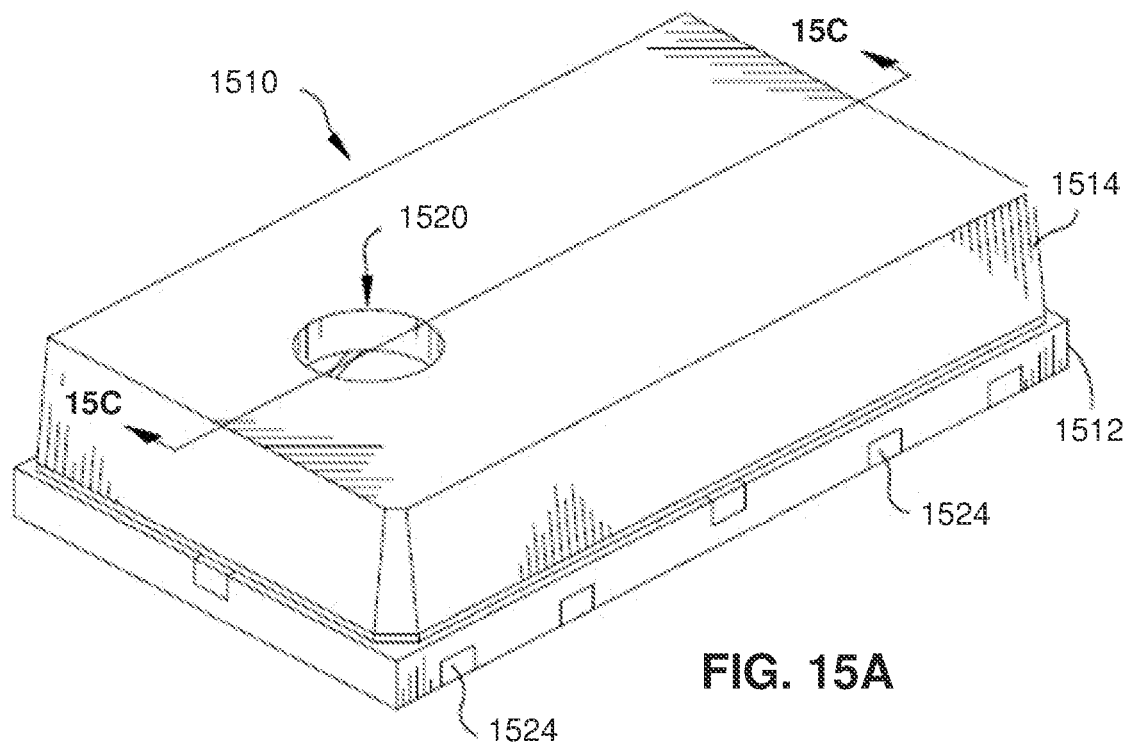
FIG. 15A illustrates a top perspective view of a packaged microphone having a microelectromechanical microphone die in accordance with one or more embodiments of this disclosure.

The digital microelectromechanical microphones having bias control functionality in accordance with this disclosure can be packaged for operation within an electronic device (a mobile phone, a tablet computer, or a wireless earbud, for example) or other types of devices including consumer electronics and appliances, for example. As an illustration, FIG. 15A presents a top, perspective view of a packaged microphone 1510 that can include a digital microelectromechanical microphone die in accordance with one or more embodiments of this disclosure (such as the digital microelectromechanical microphone 100 shown in FIG. 1). In addition, FIG. 15B presents a bottom, perspective view of the packaged microphone 1510.

As is illustrated, the packaged microphone 1510 has a package base 1512 and a lid 1514 that form an interior chamber or housing that contains a microelectromechanical microphone chipset 1516. In addition, or in other embodiments, such a chamber can include a separate microphone chipset 1518. The chipsets 1516 and 1518 are depicted in FIG. 15C and FIG. 15D and are discussed hereinafter. In the illustrated embodiment, the lid 1514 is a cavity-type lid, which has four walls extending generally orthogonally from a top, interior face to form a cavity. In one example, the lid 1514 can be formed from metal or other conductive material to shield the microelectromechanical microphone die 1516 from electromagnetic interference. The lid 1514 secures to the top face of the substantially flat package base 1512 to form the interior chamber.

As is illustrated, the lid 1514 can have an audio input port 1520 that is configured to receive audio signals (e.g., audible signals and/or ultrasonic signals) and can permit such signals to ingress into the chamber formed by the package base 1512 and the lid 1514. In additional or alternative embodiments, the audio port 1520 can be placed at another location. For example, the audio port 1512 can be placed at the package base 1512. As another example, the audio port 1512 can be placed at one of the side walls of the lid 1514. Regardless of the location of the audio port 1512, audio signals entering the interior chamber can interact with the microelectromechanical microphone chipset 1516 to produce an electrical signal representative of at least a portion of the received audio signals. With additional processing via external components (such as a speaker and accompanying circuitry), the electrical signal can produce an output audible signal corresponding to an input audible signal contained in the received audio signals.

Figure 15B:
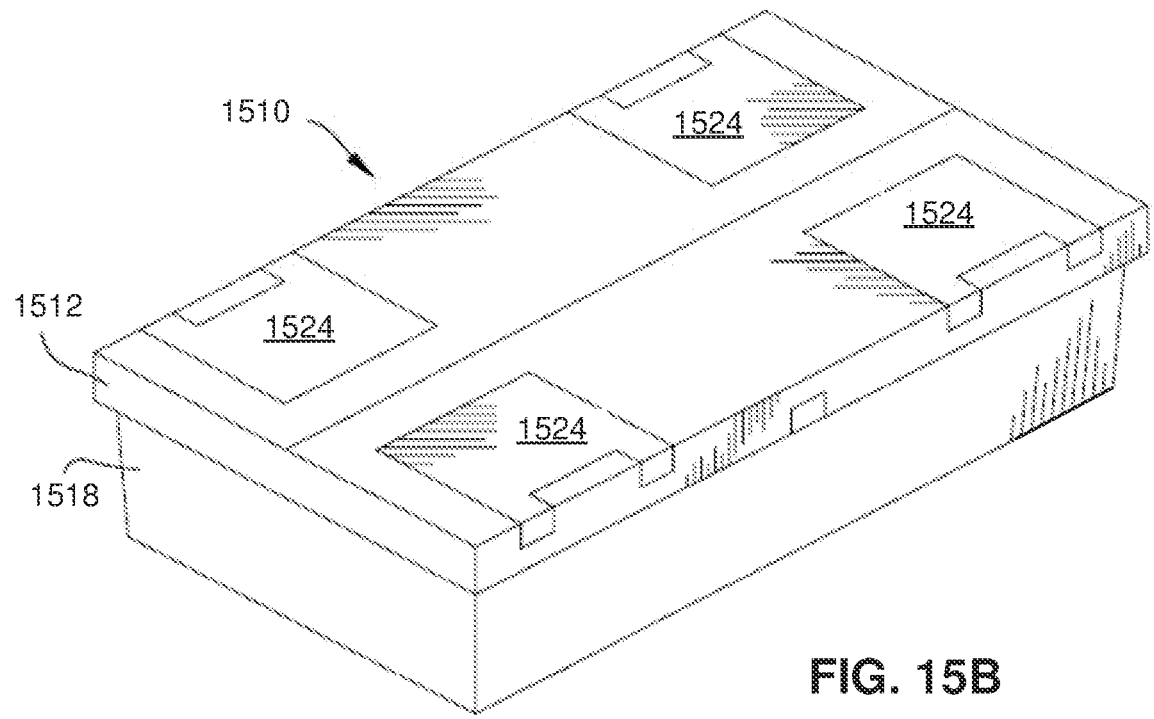
FIG. 15B illustrates a bottom perspective view of the packaged microphone illustrated in FIG. 15A.
Figure 15C:
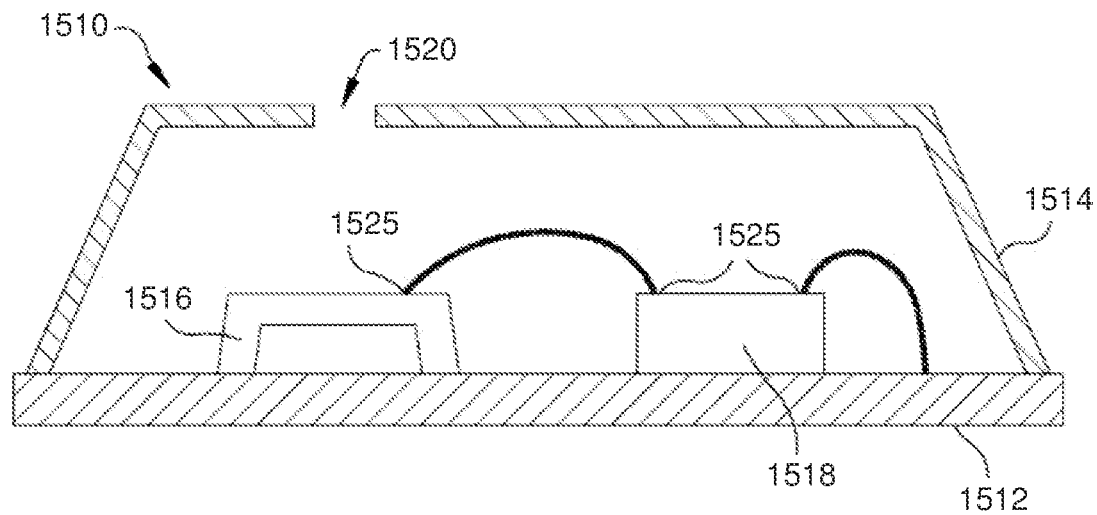
FIG. 15C illustrates a cross-sectional view of the packaged microphone illustrated in FIG. 15A.
Figure 15D:
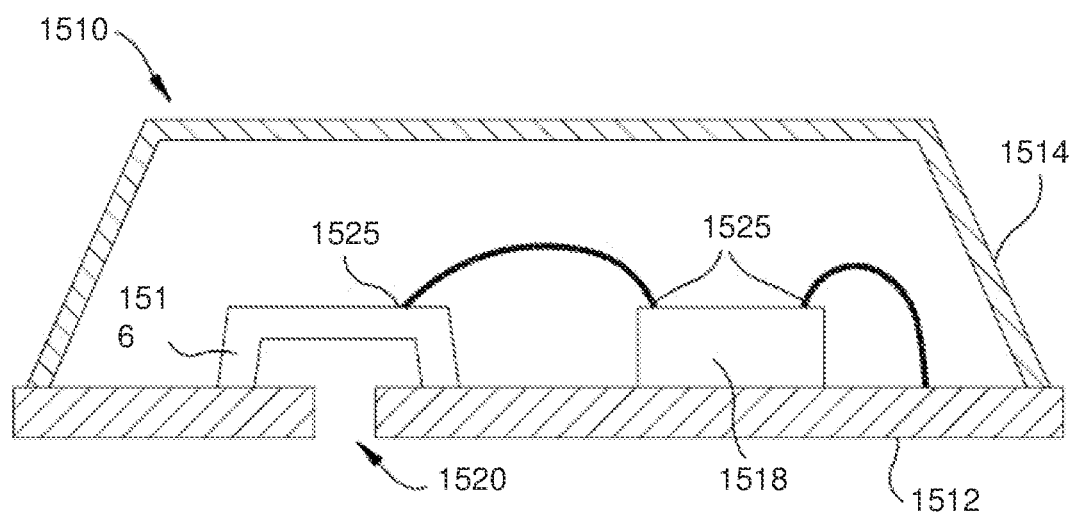
FIG. 15D illustrates a cross-sectional view of another example of a packaged microphone having a microelectromechanical microphone die in accordance with one or more embodiments of this disclosure.

FIG. 15B presents an example of a bottom face 1522 of the package base 1512. As illustrated, the bottom face 1522 has four contacts 1524 for electrically (and physically, in many use cases) connecting the microelectromechanical microphone chipset 1516 with a substrate, such as a printed circuit board or other electrical interconnect apparatus. Although four contacts 1524 are illustrated, the disclosure is not limited in that respect and other number of contacts can be implemented in the bottom face 1522. The packaged microphone 1510 can be used in any of a wide variety of applications. For example, the packaged microphone 1510 can be used with mobile telephones, landline telephones, computer devices, video games, hearing aids, hearing instruments, biometric security systems, two-way radios, public announcement systems, and other devices that transduce acoustic signals. In a particular implementation, the packaged microphone 1510 can be used within a speaker to produce audible signals from electrical signals.

In certain embodiments, the package base 1512 shown in FIG. 15A and FIG. 15B can be embodied in, or can contain, a printed circuit board material, such as FR-4, or a premolded, leadframe-type package (also referred to as a "premolded package"). Other embodiments may use or otherwise leverage different package types, such as ceramic cavity packages. Therefore, it is noted that this disclosure is not limited to a specific type of package.

FIG. 15C illustrates a cross-sectional view of the packaged microphone 1510 across line 15C-15C in FIG. 159A. As illustrated and discussed herein, the lid 1514 and base 1512 form an internal chamber or housing that contains a microelectromechanical microphone chipset 1516 and a microphone circuit chipset 1518 (also referred to as "microphone circuitry 1518") used to control and/or drive the microelectromechanical microphone chipset 1516. In certain embodiments, electronics can be implemented as a second, stand-alone integrated circuit, such as an application specific integrated circuit (e.g., an ASIC die 1518) or a field programmable gate array (e.g., FPGA die 1518). It is noted that, in some embodiments, the microelectromechanical microphone chipset 15916 and the microphone circuit chipset 1518 can be formed on a single die.

Adhesive or another type of fastening mechanism can secure or otherwise mechanically couple the microelectromechanical microphone chipset 1516 and the microphone circuit chipset 1518 to the package base 1512. Wirebonds or other type of electrical conduits can electrically connect the microelectromechanical microphone chipset 1516 and microphone circuit chipset 1518 to contact pads (not shown) on the interior of the package base 1512.

While FIGS. 15A to 15C illustrate a top-port packaged microphone design, some embodiments can position the audio input port 1520 at other locations, such as through the package base 1512. For instance, FIG. 15D illustrates a cross-sectional view of another example of a packaged microphone 1510 where the microelectromechanical microphone chipset 1516 covers the audio input port 1520, thereby producing a large back volume. In other embodiments, the microelectromechanical microphone chipset 1516 can be placed so that it does not cover the audio input port 1520 through the package base 1512.

It is noted that the present disclosure is not limited with respect to the packaged microphone 1510 illustrated in FIGS. 15A to 15D. Rather, discussion of a specific packaged microphone is for merely for illustrative purposes. As such, other microphone packages including a microelectromechanical microphone having one or multiple stoppage members in accordance with this disclosure are contemplated herein.

Various aspects of the embodiments of this disclosure are described herein with reference to flowchart illustrations and/or block diagrams of methods. The flowchart and block diagrams in the Figures illustrate the architecture, functionality, and operation of possible implementations of devices, methods, and products according to various embodiments of this disclosure. In this regard, each block in the flowchart or block diagrams can represent one or several operations for implementing the specified function(s). In some implementations, the functions noted in the blocks can occur out of the order noted in the Figures. For example, two blocks shown in succession can, in fact, be implemented substantially concurrently, or the blocks can sometimes be implemented in the reverse order.

In the present specification, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in this specification and annexed drawings should generally be construed to mean "one or more" unless specified otherwise or clear from context to be directed to a singular form.

In addition, the term "processor" can refer to substantially any computing processing unit or device including, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an ASIC, a DSP, a FPGA, a programmable logic controller (PLC), a complex programmable logic device (CPLD), a discrete gate or transistor logic, discrete hardware components or any combination thereof designed to perform the functions described herein. A processor can also be implemented as a combination of computing processing units.

Memory devices described herein can include volatile memory or nonvolatile memory or can include both volatile and nonvolatile memory. As an illustration, nonvolatile memory can include ROM, programmable ROM (PROM), electrically programmable ROM (EPROM), electrically erasable PROM (EEPROM) or flash memory. Volatile memory can include RAM, which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The memory (e.g., data storages, databases) of the embodiments is intended to include, without being limited to, these and any other suitable types of memory.

As used herein, terms describing information storage components relevant to operation and functionality of a component refer to "memory components," or entities embodied in a "memory" or components including the memory. Memory components described herein can be either volatile memory or nonvolatile memory or can include both volatile and nonvolatile memory.

In addition, the terms "example" and "such as" are utilized herein to mean serving as an instance or illustration. Any embodiment or design described herein as an "example" or referred to in connection with a "such as" clause is not necessarily to be construed as preferred or advantageous over other embodiments or designs. Rather, use of the terms "example" or "such as" is intended to present concepts in a concrete fashion. The terms "first," "second," "third," and so forth, as used in the claims and description, unless otherwise clear by context, is for clarity only and doesn't necessarily indicate or imply any order in time.

What has been described above includes examples of one or more embodiments of the disclosure. It is, of course, not possible to describe every conceivable combination of components or methodologies for purposes of describing these examples, and it can be recognized that many further combinations and permutations of the present embodiments are possible. Accordingly, the embodiments disclosed and/or claimed herein are intended to embrace all such alterations, modifications and variations that fall within the spirit and scope of the detailed description and the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A digital microphone, comprising:
   a first component that provides data indicative of a clock frequency of operation in a functional mode of a digital microphone, the clock frequency clocking one or more microphone components having switching activity;
   a second component that determines, using the clock frequency, an amount of bias current to supply to at least a first microphone component of the one or more microphone components, and based on determining that the clock frequency has remained unchanged relative to a previously measured clock frequency, implements a time delay of a defined magnitude prior to receiving and processing additional data indicative of the clock frequency; and
   a memory device that retains control parameters that include at least one of a first group of parameters defining a relationship between current and frequency and a second group of parameters defining a quantization of the relationship, the quantization including multiple bias current levels for respective frequency intervals.

2. The digital microphone of claim 1, wherein the first component comprises a detection component that receives an input signal defining a clock waveform having the clock frequency, and measures the clock frequency using the clock waveform.

3. The digital microphone of claim 2, wherein the microphone components comprise at least one voltage regulator, and wherein the detection component comprises one of an analog frequency-to-digital converter or an oscillator.

4. The digital microphone of claim 1, wherein the first component comprises an input interface that receives the data indicative of the clock frequency from a host device, the data being formatted as a word spanning a defined number of bits.

5. The digital microphone of claim 1, wherein the relationship comprises one of a linear function, a piecewise linear function, or a polynomial function, and wherein the memory device is one of a non-volatile memory device or a volatile memory device.

6. The digital microphone of claim 5, wherein the second component determines the amount of bias current by,
   receiving the data indicative of the clock frequency;
   receiving at least one parameter of the second group of parameters from the memory device;
   selecting a first bias current level corresponding to a particular frequency interval of the respective frequency intervals that includes the clock frequency; and
   configuring the amount of bias current to the selected first bias current level.

7. The digital microphone of claim 1, wherein the microphone components comprise one or more signal-path processing component including at least one analog-to-digital converters (ADCs).

8. The digital microphone of claim 1, wherein the one or more microphone components comprises multiple microphone components, and wherein the second component determines, using the clock frequency, a second amount of bias current to supply to at least a second microphone component of the multiple microphone components.

9. The digital microphone of claim 8, wherein the memory device retains a third group of parameters that define a second quantization of a second relationship between current and frequency, the second quantization including multiple second bias current levels for respective second frequency intervals.

10. The digital microphone of claim 9, wherein the second component determines the amount of bias current by,
receiving the data indicative of the clock frequency;
receiving at least one parameter of the third group of parameters from the memory device;
selecting a second bias current level corresponding to a particular frequency interval of the respective second frequency intervals that includes the clock frequency; and
configuring the second amount of bias current to the selected second bias current level.

11. A method, comprising:
supplying, by a first component of a digital microphone, data indicative of a clock frequency of operation in a functional mode of the digital microphone, the clock frequency clocking one or more microphone components having switching activity; and
determining, by a second component of the digital microphone, using the clock frequency, an amount of bias current to supply to at least a first microphone component of the one or more microphone components;
based on a determination that the clock frequency is unchanged relative to a prior measured clock frequency, implementing, by the second component, a time delay of a determined magnitude before receiving and processing future data indicative of the clock frequency,
wherein the determining, by the second component, comprising,
receiving parameters defining a quantization of a relationship between the bias current and the clock frequency, wherein the quantization includes multiple bias current levels for respective frequency intervals;
selecting a first bias current level corresponding to a particular frequency interval of the respective frequency intervals that includes the clock frequency; and
configuring the amount of bias current to the selected first bias current level.

12. The method of claim 11, further comprising supplying, by the second component, the amount of bias current to the first microphone component, wherein the first microphone component is one of an analog-to-digital converter or a voltage regulator.

13. The method of claim 11, further comprising,
receiving, by the first component, an input signal defining a clock waveform having the clock frequency; and
measuring, by the first component, the clock frequency using the clock waveform.

14. The method of claim 11, further comprising receiving, by the first component, the data defining the clock frequency from a host device, the data being formatted as a word spanning a defined number of bits.

15. The method of claim 11, wherein the digital microphone comprises a memory device storing the parameters, and wherein the relationship comprises one of a linear function, a piecewise linear function, or a polynomial function.

16. The method of claim 11, further comprising,
supplying, by the first component, second data indicative of a second clock frequency of operation in a second functional mode of the digital microphone, the second clock frequency clocking one or more microphone components having switching activity; and
determining, by the second component, using the second clock frequency, a second amount of bias current to supply to the first microphone component.

17. A digital microphone, comprising:
a processing circuit including,
a first component that provides data indicative of a clock frequency of operation in a functional mode of the digital microphone, the clock frequency clocking one or more microphone components having switching activity; and
a second component that determines, using the clock frequency, an amount of bias current to supply to at least a first microphone component of the one or more microphone components, and based on the clock frequency being unchanged in relation to a previously measure clock frequency, implements a time delay of a determined magnitude before receiving and processing additional data representative of the clock frequency; and
a microelectromechanical microphone die coupled to the circuit and configured to receive a pressure wave;
the circuit configured to generate a signal representative of the pressure wave.

18. The digital microphone of claim 17, wherein the first component comprises one of,
a detection component that identifies the clock frequency by receiving an input signal defining a clock waveform having the clock frequency, and measuring the clock frequency using the clock waveform; or
an input interface that receives the data defining the clock frequency from a host device functionally coupled to the circuit.

19. The digital microphone of claim 17, further comprising a memory device storing control parameters that include at least one of a first group of parameters defining a relationship between current and frequency or a second group of parameters defining a quantization of the relationship, wherein the quantization includes multiple bias current levels for respective frequency intervals.

20. The digital microphone of claim 19, wherein the second component determines the amount of bias current by,
receiving the data indicative of the clock frequency;
receiving at least one parameter of the second group of parameters from the memory device;
selecting a first bias current level corresponding to a first frequency interval of the respective frequency intervals that includes the clock frequency; and
configuring the amount of bias current to the selected first bias current level.

21. A device, comprising:
a first component that provides data indicative of a clock frequency of operation in a functional mode of a digital microphone, the clock frequency clocking one or more microphone components having switching activity; and a second component that determines, using the clock frequency, an amount of bias current to supply to at least a first microphone component of the one or more microphone components, and based on the clock frequency remaining unchanged in relation to a previously measured clock frequency, implements a time delay of a defined magnitude prior to receiving and processing future data indicative of the clock frequency.

22. The device of claim 21, wherein the second component comprises an analog frequency-to-current converter.

* * * * *